US012598954B2

(12) United States Patent
Matsuo et al.

(10) Patent No.: US 12,598,954 B2
(45) Date of Patent: Apr. 7, 2026

(54) ELECTRONIC STRUCTURE AND METHOD OF MANUFACTURING THE SAME

(71) Applicant: Oki Electric Industry Co., Ltd., Tokyo (JP)

(72) Inventors: Genichirou Matsuo, Tokyo (JP); Toru Kosaka, Tokyo (JP); Takahito Suzuki, Tokyo (JP); Hironori Furuta, Tokyo (JP); Shinya Jumonji, Tokyo (JP); Hiroto Kawada, Tokyo (JP); Yuuki Shinohara, Tokyo (JP); Akihiro Iino, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 469 days.

(21) Appl. No.: 18/165,442

(22) Filed: Feb. 7, 2023

(65) Prior Publication Data

US 2023/0268219 A1 Aug. 24, 2023

(30) Foreign Application Priority Data

Feb. 24, 2022 (JP) ................................. 2022-027266

(51) Int. Cl.
*H10P 72/70* (2026.01)
*H10H 20/01* (2025.01)
(Continued)

(52) U.S. Cl.
CPC ........... *H10P 72/74* (2026.01); *H10H 20/831* (2025.01); *H10H 20/852* (2025.01);
(Continued)

(58) Field of Classification Search
CPC . H01L 21/6835; H01L 21/568; H01L 25/105; H01L 25/50; H01L 2221/68318;
(Continued)

(56) References Cited

U.S. PATENT DOCUMENTS 10,153,256 B2 * 12/2018 Cok .................... H01L 25/0753
11,817,535 B2 * 11/2023 Chong ................. H10H 20/811
(Continued)

FOREIGN PATENT DOCUMENTS

JP 2017-108160 A 6/2017

*Primary Examiner* — Victor A Mandala
(74) *Attorney, Agent, or Firm* — Rabin & Berdo, P.C.

(57) ABSTRACT

An electronic structure includes: a substrate having a first surface; a functional element unit including a functional element having an electronic function, and a protector covering the functional element, the functional element unit having a second surface facing the first surface; a support disposed between the first surface and the second surface, the support supporting the second surface; and a projection disposed on a first surface side of the substrate, the projection projecting toward the functional element unit. The support has a third surface in contact with the second surface of the functional element unit, the third surface having an area smaller than an area of the second surface. The projection has a fourth surface in contact with or close to the functional element unit, the fourth surface having an area smaller than the area of the second surface, the projection being formed by a different material from the support.

20 Claims, 21 Drawing Sheets

(51) Int. Cl.

| | |
|---|---|
| *H10H 20/831* | (2025.01) |
| *H10H 20/852* | (2025.01) |
| *H10H 20/857* | (2025.01) |
| *H10H 29/14* | (2025.01) |
| *H10W 74/01* | (2026.01) |
| *H10W 90/00* | (2026.01) |

(52) U.S. Cl.
CPC .......... *H10H 20/857* (2025.01); *H10H 29/14* (2025.01); *H10W 74/019* (2026.01); *H10W 90/00* (2026.01); *H10H 20/032* (2025.01); *H10H 20/0362* (2025.01); *H10H 20/0364* (2025.01); *H10P 72/7412* (2026.01); *H10P 72/744* (2026.01)

(58) Field of Classification Search
CPC . H01L 2221/68381; H01L 2221/68368; H01L 25/0753; H10H 20/831; H10H 20/852; H10H 20/857; H10H 29/14; H10H 20/032; H10H 20/0362; H10H 20/0364; H10H 20/8314; H10H 20/84; H10H 20/01; H05K 1/181; H05K 3/00
See application file for complete search history.

(56) References Cited

U.S. PATENT DOCUMENTS

| | | | | |
|---|---|---|---|---|
| 12,046,523 | B2 * | 7/2024 | Lu ........................ | H01L 21/4846 |
| 2015/0340343 | A1 * | 11/2015 | Chen ................... | H01L 25/0657 |
| | | | | 257/737 |
| 2017/0048976 | A1 | 2/2017 | Prevatte et al. | |
| 2017/0256521 | A1 * | 9/2017 | Cok ................... | H01L 25/0753 |
| 2018/0031974 | A1 | 2/2018 | Prevatte et al. | |
| 2018/0182735 | A1 * | 6/2018 | Leuten ............. | H01L 23/49816 |
| 2020/0321390 | A1 | 10/2020 | Wu | |
| 2020/0365651 | A1 * | 11/2020 | Valtere ................. | H03H 9/1092 |
| 2020/0403114 | A1 * | 12/2020 | Meng ................. | H01L 25/0753 |
| 2023/0157055 | A1 * | 5/2023 | Furuta ............... | H10H 20/0362 |
| | | | | 257/40 |
| 2024/0063078 | A1 * | 2/2024 | Kuo ........................ | H01L 23/13 |

* cited by examiner

FIG. 2

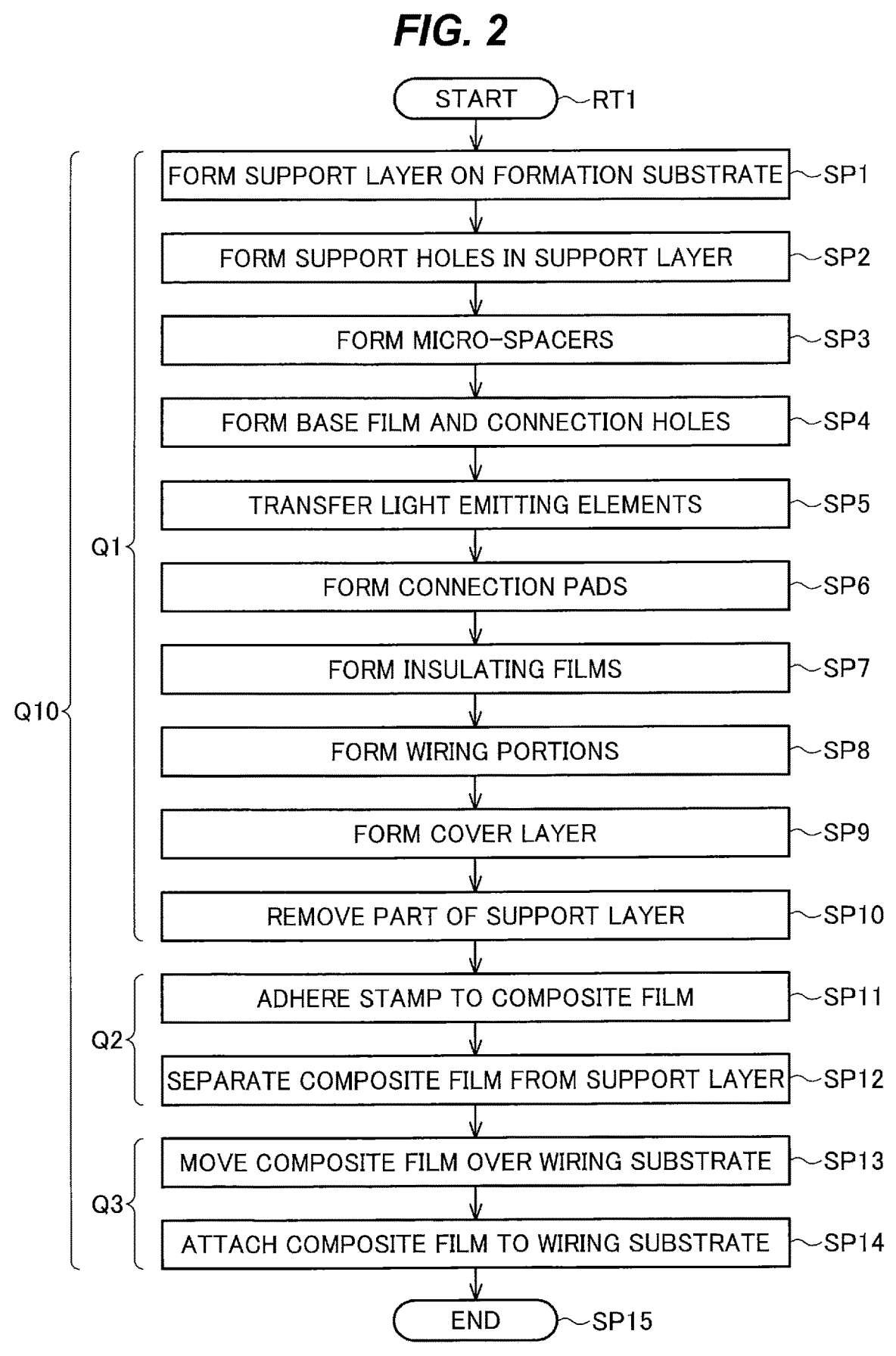

```
              ( START )──RT1

┌──────────────────────────────────────────────────┐
    │ FORM SUPPORT LAYER ON FORMATION SUBSTRATE │──SP1
    └──────────────────────────────────────────────────┘

┌──────────────────────────────────────────────────┐
    │      FORM SUPPORT HOLES IN SUPPORT LAYER      │──SP2
    └──────────────────────────────────────────────────┘

┌──────────────────────────────────────────────────┐
    │              FORM MICRO-SPACERS              │──SP3
    └──────────────────────────────────────────────────┘

┌──────────────────────────────────────────────────┐
    │     FORM BASE FILM AND CONNECTION HOLES     │──SP4
    └──────────────────────────────────────────────────┘

┌──────────────────────────────────────────────────┐
    │       TRANSFER LIGHT EMITTING ELEMENTS       │──SP5
    └──────────────────────────────────────────────────┘

┌──────────────────────────────────────────────────┐
    │             FORM CONNECTION PADS             │──SP6
    └──────────────────────────────────────────────────┘

┌──────────────────────────────────────────────────┐
    │             FORM INSULATING FILMS             │──SP7
    └──────────────────────────────────────────────────┘

┌──────────────────────────────────────────────────┐
    │              FORM WIRING PORTIONS              │──SP8
    └──────────────────────────────────────────────────┘

┌──────────────────────────────────────────────────┐
    │               FORM COVER LAYER               │──SP9
    └──────────────────────────────────────────────────┘

┌──────────────────────────────────────────────────┐
    │          REMOVE PART OF SUPPORT LAYER          │──SP10
    └──────────────────────────────────────────────────┘

┌──────────────────────────────────────────────────┐
    │       ADHERE STAMP TO COMPOSITE FILM       │──SP11
    └──────────────────────────────────────────────────┘

┌──────────────────────────────────────────────────┐
    │ SEPARATE COMPOSITE FILM FROM SUPPORT LAYER │──SP12
    └──────────────────────────────────────────────────┘

┌──────────────────────────────────────────────────┐
    │  MOVE COMPOSITE FILM OVER WIRING SUBSTRATE  │──SP13
    └──────────────────────────────────────────────────┘

┌──────────────────────────────────────────────────┐
    │  ATTACH COMPOSITE FILM TO WIRING SUBSTRATE  │──SP14
    └──────────────────────────────────────────────────┘

( END )──SP15
```

Q1 brackets SP1–SP10; Q2 brackets SP11–SP12; Q3 brackets SP13–SP14; Q10 brackets SP1–SP14.

FIG. 7A
FIG. 7B
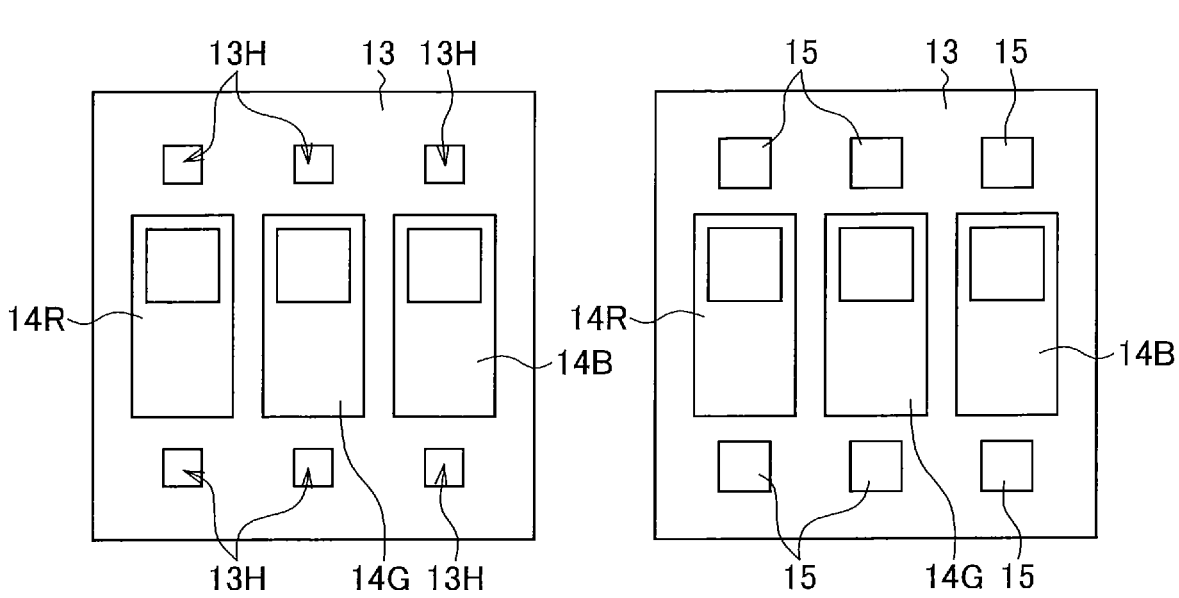
FIG. 7C
FIG. 7D
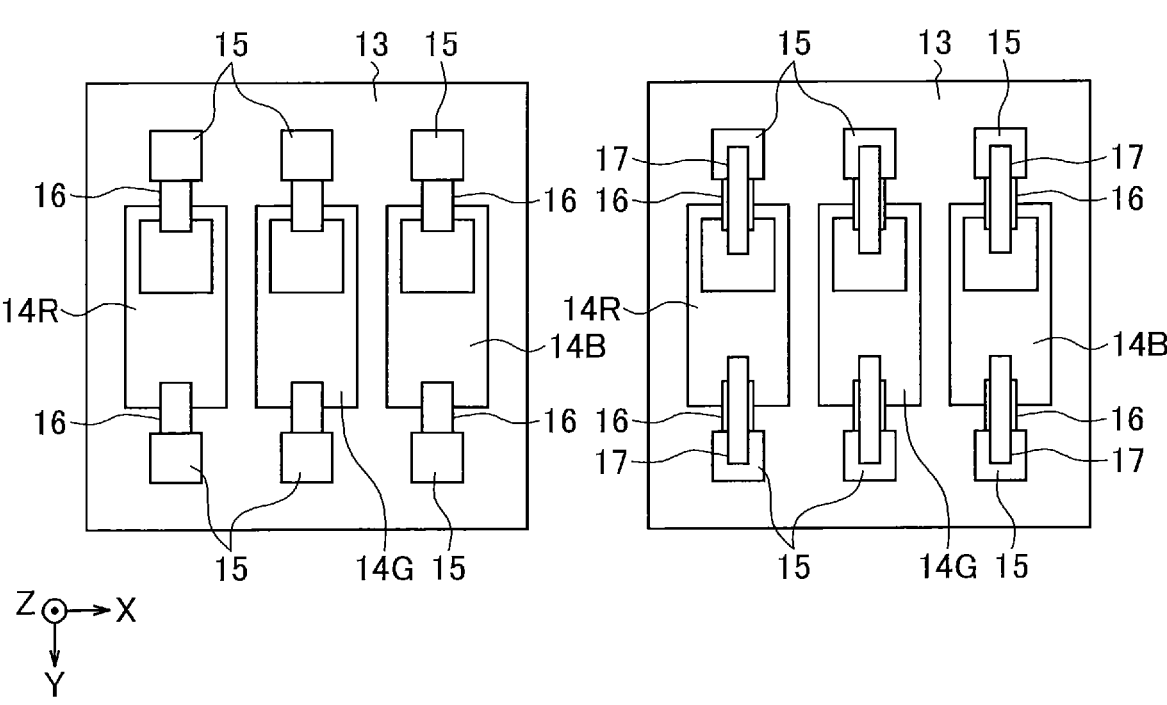

*FIG. 8A*
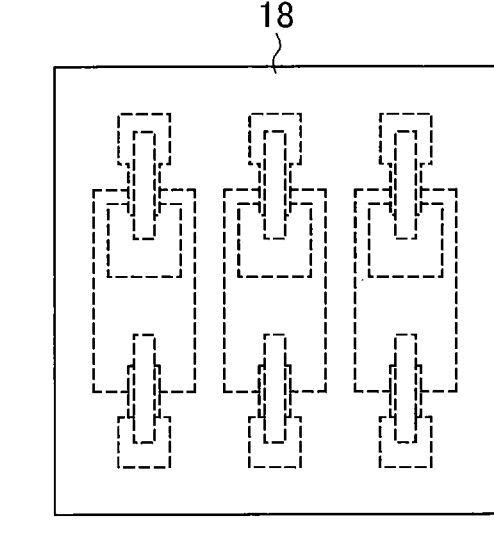
*FIG. 8B*
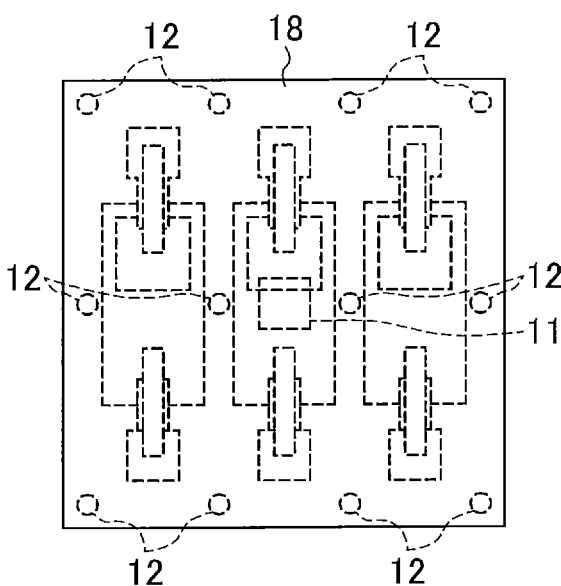
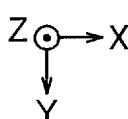

ELECTRONIC STRUCTURE AND METHOD OF MANUFACTURING THE SAME

BACKGROUND OF THE INVENTION

1. Field of the Invention

The present disclosure relates to an electronic structure and a method of manufacturing the same, and is preferably used in manufacturing a film including multiple electronic elements and attaching the film to a wiring substrate.

2. Description of the Related Art

In general, electronic circuits are manufactured by mounting electronic elements (also referred to as devices) having various functions on wiring substrates. There has been recently developed a technique of forming a single film including different types of electronic elements and attaching the film to a wiring substrate, thereby simplifying the mounting process.

As an example, a micro light emitting diode (LED) display panel to be installed in a display device has a configuration in which each pixel is constituted by light emitting elements (which are LEDs) of three colors of, for example, red, green, and blue, and a large number of light emitting elements are arranged in a matrix on a circuit substrate. The micro LED display panel can be manufactured by, for example, forming composite films that are each in the form of a single thin film and each include red, green, and blue light emitting elements corresponding to one pixel, and attaching the composite films to a wiring substrate in a matrix.

Japanese Patent Application Publication No. 2017-108160 discloses a method of manufacturing an electronic structure. The method includes applying a first polymer layer to a substrate, removing a selected portion of the first polymer layer to provide a via that extends through the first polymer layer to the substrate, applying a second polymer layer to the first polymer layer such that an anchor is formed in the via, disposing an electronic device layer on the second polymer layer, and selectively removing the first polymer layer by etching to provide an electronic structure, which is contacted with the substrate via the anchor and can be separated from the substrate.

However, in the above technique, the area of the anchor is smaller than the area of the electronic structure. Thus, a portion of the electronic structure away from the anchor may droop to adhere strongly to the substrate, which may degrade the separation.

SUMMARY OF THE INVENTION

An object of the present disclosure is to provide an electronic structure that can provide good separation of a composite film from a substrate, and a method of manufacturing such an electronic structure.

According to an aspect of the present disclosure, there is provided an electronic structure including: a substrate having a first surface; a functional element unit including a functional element having an electronic function, and a protector covering the functional element, the functional element unit having a second surface facing the first surface; a support disposed between the first surface of the substrate and the second surface of the functional element unit, the support supporting the second surface of the functional element unit; and a projection disposed on a first surface side of the substrate, the projection projecting toward the functional element unit, wherein the support has a third surface in contact with the second surface of the functional element unit, the third surface having an area smaller than an area of the second surface, and wherein the projection has a fourth surface in contact with or close to the functional element unit, the fourth surface having an area smaller than the area of the second surface, the projection being formed by a different material from the support.

According to another aspect of the present disclosure, there is provided a method of manufacturing an electronic structure, the method including: preparing a substrate having a first surface; forming a support having a third surface on the first surface of the substrate; forming a projection having a fourth surface on the first surface of the substrate; forming, on the support and the projection, a functional element unit including a functional element having an electronic function, and a protector covering the functional element, the functional element unit having a second surface facing the third surface and the fourth surface; and removing part of the support to make an area of the third surface of the support smaller than an area of the second surface, wherein the projection is formed such that an area of the fourth surface is smaller than the area of the second surface, and is formed by a different material from the support.

According to another aspect of the present disclosure, there is provided a method of manufacturing an electronic structure, the method including: preparing a substrate having a first surface; forming a support having a third surface on the first surface of the substrate; forming a projection having a fourth surface on the first surface of the substrate; forming, on the support and the projection, a functional element unit including a functional element having an electronic function, and a protector covering the functional element, the functional element unit having a second surface facing the third surface and the fourth surface; and removing the support, wherein the projection is formed such that an area of the fourth surface is smaller than an area of the second surface, and is formed by a different material from the support.

With the above aspects of the present disclosure, it is possible to provide an electronic structure that can provide good separation of a composite film from a substrate, and a method of manufacturing such an electronic structure.

BRIEF DESCRIPTION OF THE DRAWINGS

In the attached drawings:

FIG. 2 is a flowchart illustrating a manufacturing, separation, and mounting process according to the first embodiment;

FIGS. 7A to 7D are schematic plan views illustrating manufacture of the electronic structure according to the first embodiment;

FIGS. 8A and 8B are schematic plan views illustrating manufacture of the electronic structure according to the first embodiment;

DETAILED DESCRIPTION OF THE INVENTION

Embodiments of the present disclosure will be described below with reference to the drawings.

1. First Embodiment

1-1. Configurations of Electronic Structure and Composite Film>

Figure 1A:
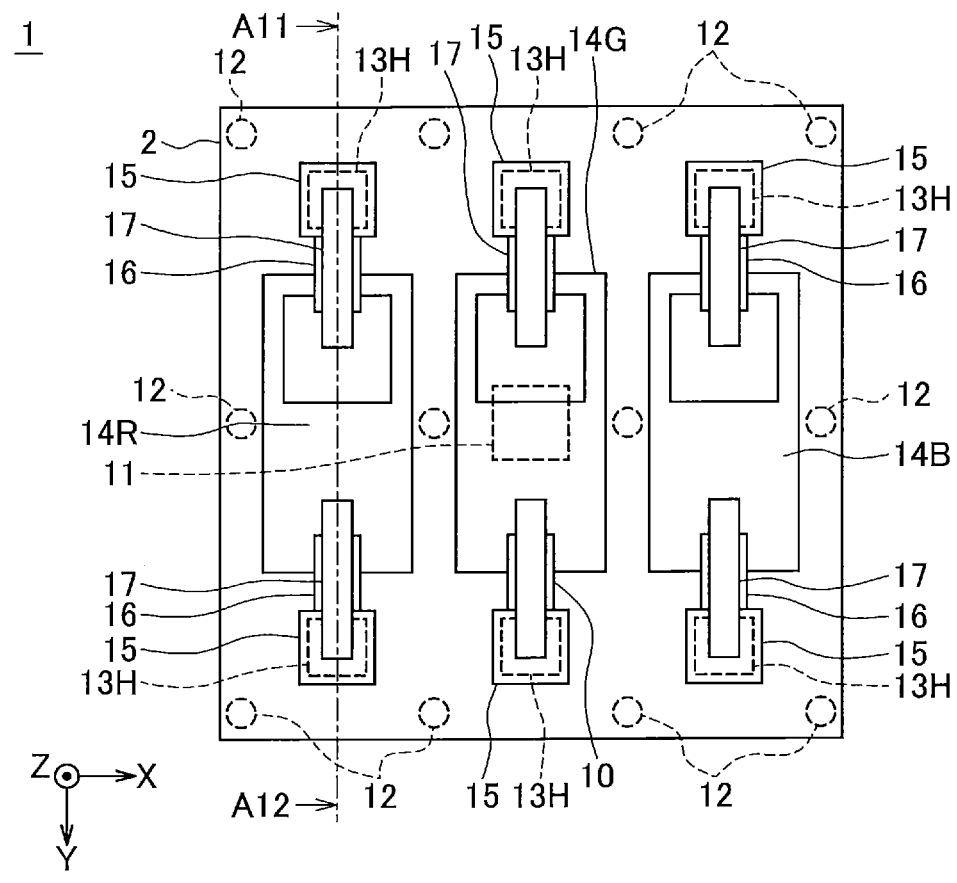
FIGS. 1A and 1B are a schematic plan view and a schematic cross-sectional view illustrating a configuration of an electronic structure according to a first embodiment.
Figure 1B:
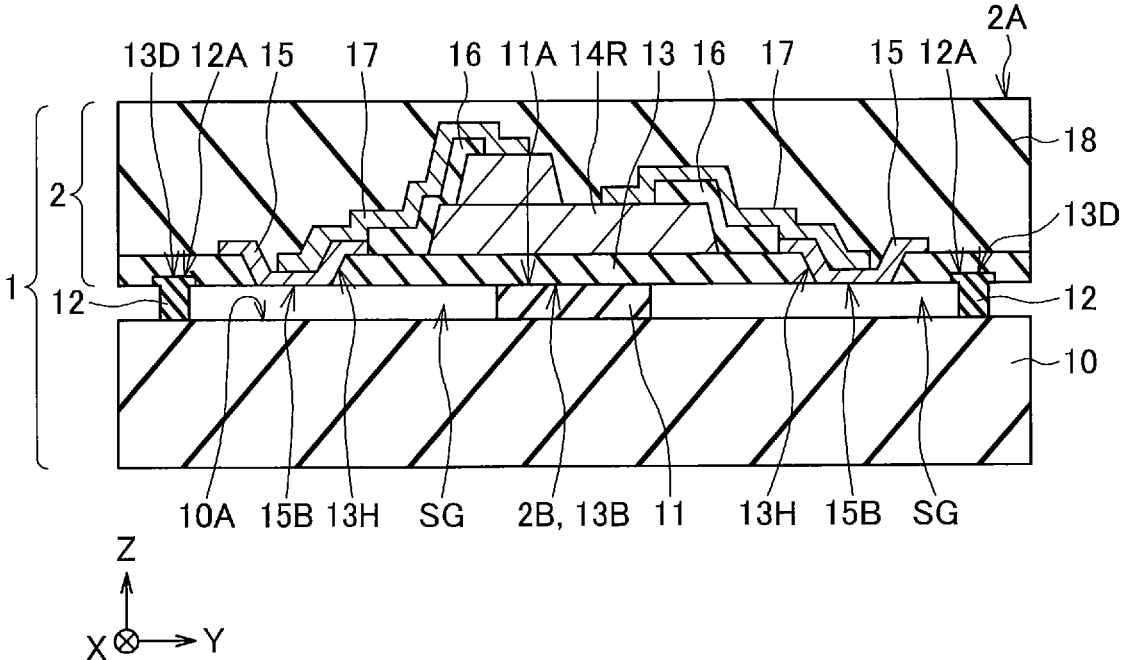

FIG. 1A is a schematic plan view illustrating configurations of an electronic structure 1 and a composite film 2 according to a first embodiment. FIG. 1B is a schematic cross-sectional view illustrating a cross-section taken along line A11-A12 of FIG. 1A. The electronic structure 1 has a configuration in which a support layer 11 and micro-spacers

12 are disposed on a formation substrate 10 and the composite film 2 is disposed on the support layer 11 and micro-spacers 12.

For convenience of explanation, in the first embodiment, the rightward direction in FIG. 1A is taken as an X direction, the downward direction in FIG. 1A is taken as a Y direction, and the direction from the back side to the front side of the drawing sheet of FIG. 1A is taken as a Z direction. Also, for convenience of explanation, the Z direction sides of parts are also referred to as front sides, and the sides opposite thereto are also referred to as back sides.

The composite film 2 has an edge along the X direction having a length of about 30 to 50 μm, an edge along the Y direction having a length of about 30 to 50 μm, and an edge along the Z direction having a length of about 1 to 15 μm, for example. The composite film 2 has a configuration in which light emitting elements of three colors of red (R), green (G), and blue (B) are arranged in order in the X direction, each connected to wiring members and connection terminals, and integrated into a single film-shaped package. Specifically, the composite film 2 is constituted by a base film 13, light emitting elements 14R, 14G, and 14B (which may be referred to as light emitting elements 14), connection pads 15, insulating films 16, wiring portions 17, and a cover layer 18.

The composite film 2 is also referred to as a functional element unit, the light emitting elements 14 are also referred to as functional elements, and the connection pads 15 are also referred to as conductive members. Also, the light emitting elements 14, wiring portions 17, and connection pads 15 have an electronic function of emitting light in response to supply of current, and thus are referred to collectively as a functional portion. Moreover, in the composite film 2, respective parts relating to the light emitting elements 14 of the respective colors have the same configurations. Thus, hereinafter, the parts relating to the red light emitting element 14R will be mainly described, and part of the description of the parts relating to the green light emitting element 14G and blue light emitting element 14B will be omitted.

As illustrated in FIG. 1B, the composite film 2 is stacked on the Z direction side (i.e., front side) of the formation substrate 10, support layer 11, and micro-spacers 12, and constitutes the electronic structure 1 together with them. The formation substrate 10 is a plate-shaped member formed by inorganic material, and has sufficient strength. Specifically, plate-shaped members formed by various inorganic materials, such as silicon substrates formed by silicon (Si), glass substrates, or sapphire substrates, can be used as the formation substrate 10. A formation substrate front surface 10A that is a front surface of the formation substrate 10 is formed to be extremely flat, and has a surface roughness (or roughness) of 10 nm or less. The formation substrate front surface 10A is also referred to as a first surface.

The support layer 11, serving as a support, is formed in a thin-film shape by inorganic material, such as silicon oxide ($SiO_2$) or silicon nitride (SiN). A support layer front surface 11A that is a front surface of the support layer 11 is formed to be extremely flat similarly to the front surface of the formation substrate 10, and has a surface roughness of 10 nm or less. Also, the support layer 11 is located at or near a center of a back surface (i.e., the –Z direction side) of the composite film 2. Specifically, in each of the X and Y directions, the support layer 11 is located at or near a center of the back surface.

The micro-spacers 12 are formed by organic material, such as polyimide, polyamide, acrylic resin, epoxy resin, or silicon resin. Each micro-spacer 12 is formed in a cylindrical shape along the Z direction and has a diameter sufficiently smaller (or shorter) than a length of the support layer 11 in the X or Y direction. The cross-sectional area of each micro-spacer 12 in an XY plane is, for example, about several tens of square micrometers, and is sufficiently smaller than the area of the support layer front surface 11A. Each micro-spacer 12 is formed in a shape such that the micro-spacer 12 projects from the formation substrate front surface 10A of the formation substrate 10 toward the composite film 2 (i.e., in the Z direction).

Thus, the micro-spacers 12 are also referred to as projections.

In the electronic structure 1, the micro-spacers 12 are disposed at 12 positions forming a matrix and having 4 positions spaced at predetermined intervals in the X direction and 3 positions spaced at predetermined intervals in the Y direction. Each micro-spacer 12 is spaced not less than a predetermined distance from the support layer 11 in each of the X and Y directions.

In an aspect, in the electronic structure 1, it is possible that when two of the micro-spacers 12 are appropriately selected, the two micro-spacers 12 are located opposite each other with the support layer 11 therebetween, on the formation substrate front surface 10A. For example, in FIG. 1B, the micro-spacer 12 on the −Y direction side and the micro-spacer 12 on the Y direction side are located opposite each other with the support layer 11 therebetween.

A composite film back surface 2B that is a back surface of the composite film 2 is in contact with the support layer front surface 11A in a limited portion at or near a center of the composite film back surface 2B in the X and Y directions. The composite film back surface 2B is extremely smooth similarly to the support layer front surface 11A, and has a surface roughness of 10 nm or less. The composite film back surface 2B is also referred to as a second surface. The support layer front surface 11A is also referred to as a third surface. Micro-spacer front surfaces 12A that are upper surfaces (or surfaces on the Z direction side) of the micro-spacers 12 are also referred to as fourth surfaces.

The formation substrate 10, support layer 11, and micro-spacers 12 are used in a manufacturing step of the composite film 2, and the composite film 2 is completed by separating the composite film 2 from the support layer 11 and micro-spacers 12. The completed composite film 2 is mounted on a wiring substrate (to be described later).

Thus, in the electronic structure 1, the composite film 2 is close to completion, adhering to the formation substrate 10, support layer 11, and micro-spacers 12. The electronic structure 1 has such a configuration, thereby allowing the composite film 2 to be easily handled together with the formation substrate 10 in transportation, storage, or the like while protecting the composite film back surface 2B.

The base film 13 is formed by organic material, such as polyimide resin, acrylic resin, or epoxy resin, and is electrically insulating. The base film 13 is formed generally in a flat rectangular parallelepiped shape or a thin flat-plate shape, and has an edge along the Z direction having a length significantly smaller than those of edges along the X and Y directions of the base film 13. Hereinafter, a back surface of the base film 13 will be referred to as a base film back surface 13B. The base film back surface 13B is formed to be extremely flat, and has a surface roughness (or roughness) of 10 nm or less.

The base film 13 is larger than the support layer 11 in each of the X and Y directions, and protrudes greatly from the support layer 11 in each of the X, −X, Y, and −Y directions.

Thus, the support layer 11 is formed to be sufficiently smaller than the base film 13 in the X and Y directions. Accordingly, in the electronic structure 1, a support gap SG is formed outside the support layer 11 and between the formation substrate 10 and the base film 13.

Moreover, on the Y direction side (which is the lower side in FIG. 1A) of the base film 13, a connection hole 13H having a square shape and passing through the base film 13 in the Z direction is formed at each of three positions spaced from each other in the X direction. Also, on the −Y direction side (which is the upper side in FIG. 1A) of the base film 13, a connection hole 13H having a square shape and passing through the base film 13 in the Z direction is formed at each of three positions spaced from each other in the X direction.

In addition, in a surface of the base film 13 on the −Z direction side, a recess 13D depressed in the Z direction is formed at each of positions where the micro-spacers 12 are disposed. Thus, the micro-spacer front surfaces 12A of the respective micro-spacers 12 are located in the respective recesses 13D.

The red light emitting element 14R is an electronic element formed by, for example, gallium arsenide (GaAs) based material, and is a functional element forming a red light emitting diode. The red light emitting element 14R is disposed on the −X direction side of a front surface of the base film 13 and at or near a center of the front surface of the base film 13 in the Y direction. In a surface of the light emitting element 14R on the Z direction side, a portion on the −Y direction side is an anode terminal, and a portion on the Y direction side is a cathode terminal.

The green light emitting element 14G is an electronic element formed by, for example, gallium nitride (GaN) based material, and is a functional element forming a green light emitting diode. The light emitting element 14G is formed in the same shape as the light emitting element 14R, and is slightly spaced from the light emitting element 14R in the X direction on the front surface of the base film 13.

The blue light emitting element 14B is an electronic element formed by, for example, gallium nitride (GaN) based material, and is a functional element forming a blue light emitting diode. The light emitting element 14B is formed in the same shape as the light emitting element 14R, and is slightly spaced from the light emitting element 14G in the X direction on the front surface of the base film 13. As such, two or more types of different functional elements are disposed in the composite film 2.

Each connection pad 15 is a thin film formed by conductive metal material, such as gold (Au) or platinum (Pt), and thus is a metal film. Each connection pad 15 is disposed in such a manner as to fill the corresponding connection hole 13H in the base film 13 and lie on the front surface of the base film 13 around the corresponding connection hole 13H. The connection pads 15 are disposed such that one connection pad 15 is disposed on each of the Y and −Y direction sides of each light emitting element 14. Each connection pad 15 has a connection pad back surface 15B that is a surface on the −Z direction side. The connection pad back surface 15B of each connection pad 15 is formed to be extremely flat similarly to the base film back surface 13B, and has a surface roughness (or roughness) of 10 nm or less.

In the composite film 2, the base film back surface 13B and connection pad back surfaces 15B form a substantially continuous flat surface, which is the composite film back surface 2B. In the composite film back surface 2B, the distance, i.e., the height of the step, between the base film back surface 13B and each connection pad back surface 15B in the Z direction is extremely small. Specifically, the height of each step in the composite film back surface 2B is not more than one thousandth of the length of the shortest side, i.e., the length of the shorter of a side along the X direction and a side along the Y direction, of the outer shape of the composite film 2 on an XY plane.

Each insulating film 16 is formed by insulating material, such as silicon oxide ($SiO_2$). Two insulating films 16 are provided for the light emitting element 14R. Specifically, one insulating film 16 is disposed on each of the Y and –Y direction sides of the light emitting element 14R. The two insulating films 16 covers mainly side surfaces of the light emitting element 14R on the –Y and Y direction sides and their neighboring portions. The same applies to the light emitting elements 14G and 14B.

Each wiring portion 17 is formed by conductive metal material, such as gold (Au), aluminum (Al), copper (Cu), titanium (Ti), or platinum (Pt). Two wiring portions 17 are disposed on the –Y and Y direction sides of the light emitting element 14R, and electrically connect the light emitting element 14R to the corresponding connection pads 15. The same applies to the light emitting elements 14G and 14B.

The cover layer 18 is formed by organic material, such as polyimide resin, similarly to the base film 13, and is disposed to cover upper portions of the base film 13, light emitting elements 14, connection pads 15, insulating films 16, and wiring portions 17. A front surface of the cover layer 18, i.e., a front surface of the composite film 2 (hereinafter also referred to as a composite film front surface 2A), is formed to be generally flat. The base film 13 and cover layer 18 are also referred to as a protector.

As above, in the composite film 2, the light emitting elements 14 of three colors are arranged on the front surface side of the base film 13, and the connection pad back surfaces 15B of the connection pads 15, which are electrically connected to the light emitting elements 14, form a substantially flat surface together with the base film back surface 13B.

In the electronic structure 1, the base film 13 and cover layer 18 are both formed by organic material. Thus, the base film 13 and cover layer 18 form relatively strong bonds, such as covalent bonds or hydrogen bonds, at the molecular level. Also, in the electronic structure 1, the formation substrate 10 and support layer 11 are both formed by inorganic material. Thus, the formation substrate 10 and support layer 11 form relatively strong bonds, such as covalent bonds or hydrogen bonds, at the molecular level.

On the other hand, in the electronic structure 1, while the support layer 11 is formed by inorganic material, the base film 13 is formed by organic material. Thus, the support layer 11 and base film 13 form relatively weak bonds, such as van der Waals bonds, at the molecular level. Also, in the electronic structure 1, the outline of the support layer 11 in an XY plane is smaller than the outline of the base film 13 in an XY plane. Thus, the area of contact between the support layer 11 and the base film 13 is smaller than the total area of the base film 13.

Thus, in the electronic structure 1, of the forces acting between the stacked layers, the force acting between the support layer 11 and the base film 13 is the smallest. Thus, in the electronic structure 1, in a state where the formation substrate 10 is fixed, if a sufficiently large force in the Z direction is applied to the cover layer 18, the base film 13 is separated from the support layer 11, and the composite film 2 is separated from the formation substrate 10, support layer 11, and the like.

1-2. Manufacture of Electronic Structure, and Separation and Mounting of Composite Film Next, manufacture of the electronic structure 1, and separation and mounting of the composite film 2 will be described with reference to FIGS. 2, 3A to 3F, 4A to 4D, 5A to 5C, 6A to 6D, 7A to 7D, and 8A and 8B. FIG. 2 is a flowchart illustrating a manufacturing, separation, and mounting process RT1 involving manufacture of the electronic structure 1, and separation and mounting of the composite film 2. FIGS. 3A to 3F, 4A to 4D, 5A to 5C are schematic cross-sectional views of the electronic structure 1 and composite film 2 illustrating steps of the process RT1 in a stepwise manner. FIGS. 6A to 6D, 7A to 7D, and 8A and 8B are schematic plan views (i.e., views as viewed from the Z direction side) of the electronic structure 1 and composite film 2 illustrating steps of the process RT1 in a stepwise manner. Here, the Z direction side will also be referred to as the upper side, and the –Z direction side will also be referred to as the lower side.

The electronic structure 1 is manufactured by stacking multiple layers on the formation substrate 10 in a stepwise manner, through various processes similar to those in manufacturing common semiconductor devices, by means of a predetermined manufacturing, separation, and mounting apparatus 80. Then, the composite film 2, which is a part of the electronic structure 1, is separated from the support layer 11 and micro-spacers 12 by the apparatus 80, and is mounted to a wiring substrate 90 (to be described later) through various processes similar to those in manufacturing or mounting common semiconductor devices.

Figure 3A:
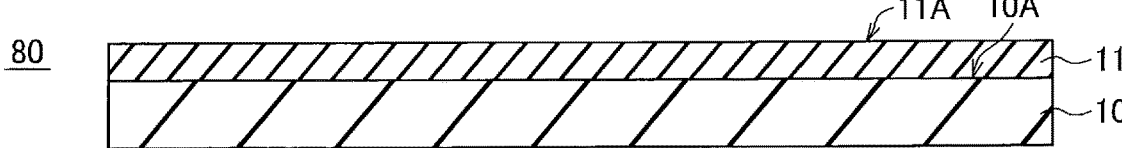
FIGS. 3A to 3F are schematic cross-sectional views illustrating manufacture of the electronic structure according to the first embodiment.
Figure 6A:
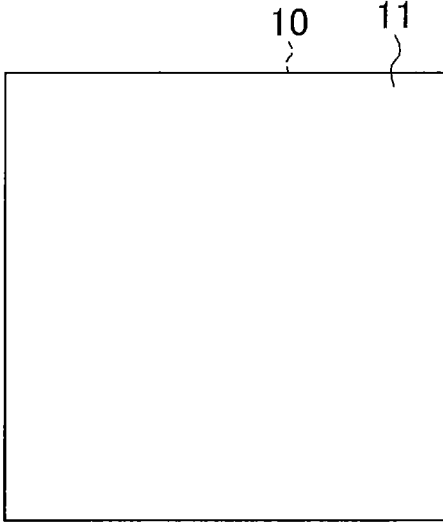
FIGS. 6A to 6D are schematic plan views illustrating manufacture of the electronic structure according to the first embodiment.

Specifically, upon starting the process RT1 (see FIG. 2), the apparatus 80 proceeds to the first step SP1, forms a support layer 11 on a formation substrate front surface 10A of a formation substrate 10 as illustrated in FIGS. 3A and 6A, and proceeds to the next step SP2. Specifically, the apparatus 80 forms a support layer 11 with inorganic material in a thin-film shape by using, for example, chemical vapor deposition (CVD). At this time, the support layer front surface 11A is formed to be extremely flat similarly to the formation substrate front surface 10A.

Figure 3B:
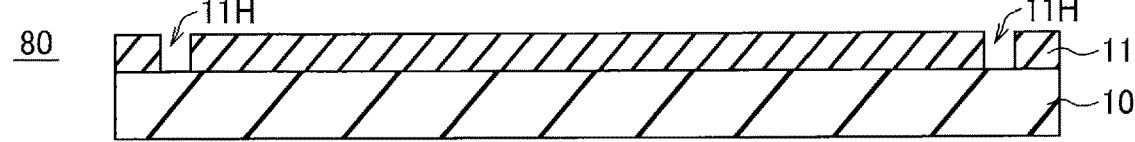
Figure 6B:
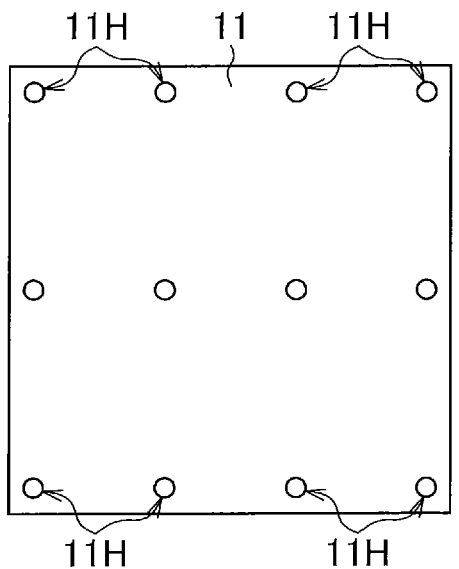

In step SP2, as illustrated in FIGS. 3B and 6B, the apparatus 80 forms support holes 11H passing through the support layer 11 in the Z direction at multiple positions in the support layer 11 by etching, and proceeds to the next step SP3. Each support hole 11H is a circular hole having a circular shape as viewed in the Z direction.

Figure 3C:
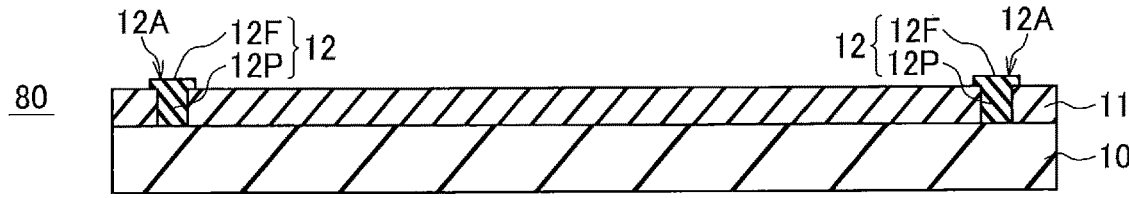
Figure 6C:
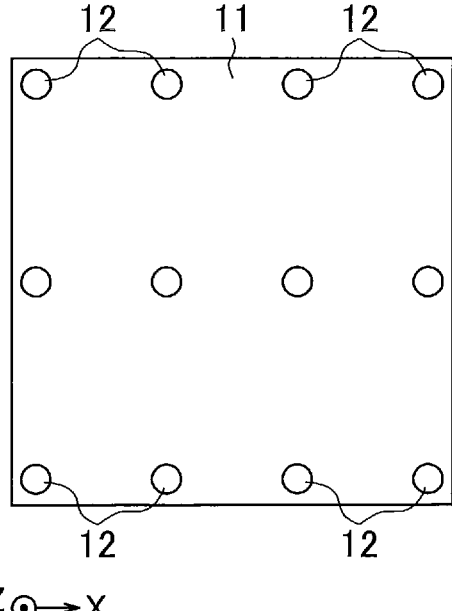

In step SP3, as illustrated in FIGS. 3C and 6C, the apparatus 80 forms micro-spacers 12 at the respective support holes 11H, and proceeds to the next step SP4. Specifically, the apparatus 80 deposits organic material, such as polyimide, in and around the support holes 11H of the support layer 11, by a known process such as lithography. At this time, the apparatus 80 causes the organic material to fill the support holes 11H and slightly overflow therefrom to extend around the support holes 11H.

Hereinafter, for each micro-spacer 12, a cylindrical portion of the micro-spacer 12 located in the support hole 11H will be referred to as a pillar portion 12P, and a portion of the micro-spacer 12 formed above the pillar portion 12P and projecting from the pillar portion 12P in the X and Y directions will be referred to as a flange portion 12F. The flange portion 12F has a diameter larger than that of the pillar portion 12P. The micro-spacer front surfaces 12A are located above (or on the Z direction side of) the support layer front surface 11A.

Figure 3D:
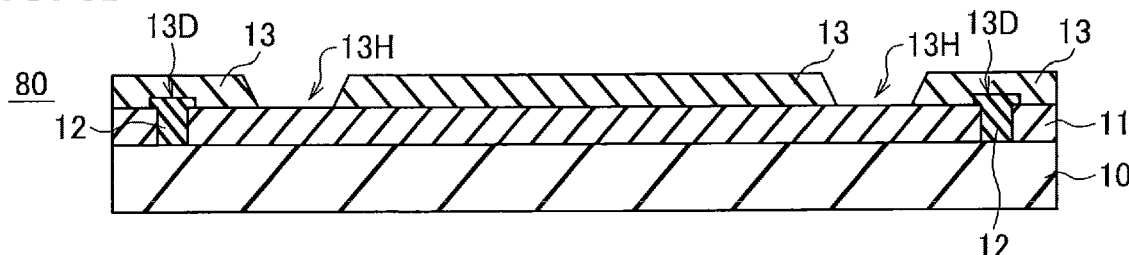
Figure 6D:
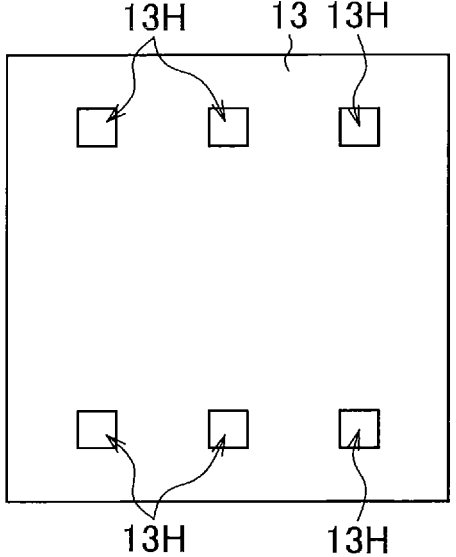

In step SP4, as illustrated in FIGS. 3D and 6D, the apparatus 80 forms a base film 13, and proceeds to the next step SP5. Specifically, the apparatus 80 forms a base film 13 on the support layer front surface 11A with organic material in a thin-film shape such that the base film 13 covers the micro-spacers 12, and forms connection holes 13H, by performing a known patterning process such as lithography.

At this time, a base film back surface 13B of the base film 13 is formed in contact (or close contact) with the support layer front surface 11A, and thus is formed to be extremely flat similarly to the support layer front surface 11A. However, at the positions where the micro-spacers 12 are formed, portions of the base film 13 corresponding to the flange portions 12F are depressed in the Z direction, so that recesses 13D are formed.

Figure 3E:
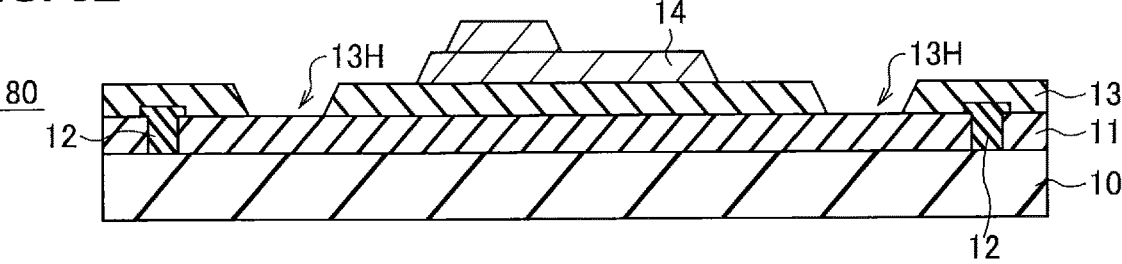

In step SP5, as illustrated in FIGS. 3E and 7A, the apparatus 80 disposes light emitting elements 14 on the base film 13, and proceeds to the next step SP6. The light emitting elements 14 are separately manufactured by a predetermined LED manufacturing apparatus (not illustrated) or the like. The apparatus 80 transfers the light emitting elements 14 to predetermined positions on the base film 13 by using a known transfer technique.

Figure 3F:
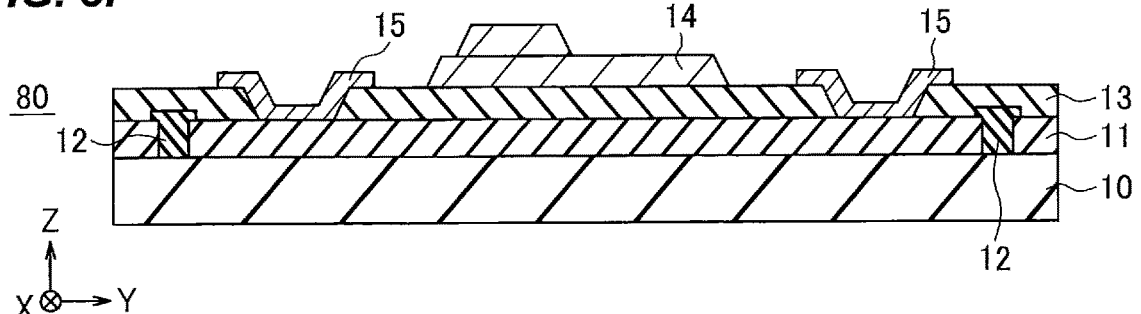

In step SP6, as illustrated in FIGS. 3F and 7B, the apparatus 80 forms connection pads 15 in and around the connection holes 13H of the base film 13, and proceeds to the next step SP7. Specifically, the apparatus 80 forms the connection pads 15 by depositing metal material, such as gold (Au) or platinum (Pt), in a thin-film shape in and around the respective connection holes 13H of the base film 13 by a method such as lithography and vapor deposition. At this time, the connection pad back surfaces 15B of the connection pads 15 are formed in contact (or close contact) with the support layer front surface 11A, and thus are extremely smooth, similarly to the base film back surface 13B of the base film 13.

Figure 4A:
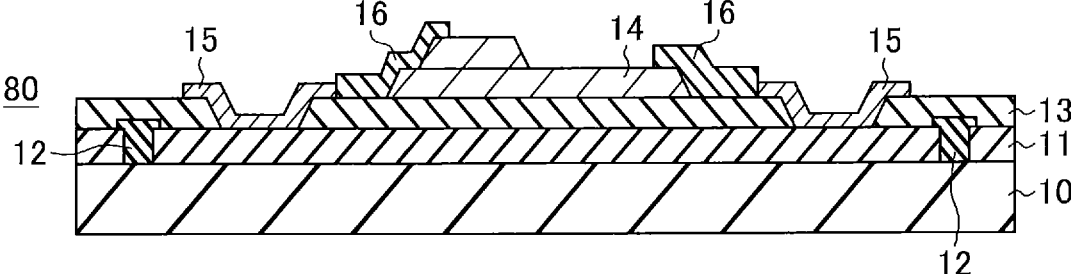
FIGS. 4A to 4D are schematic cross-sectional views illustrating manufacture of the electronic structure according to the first embodiment.
Figure 4B:
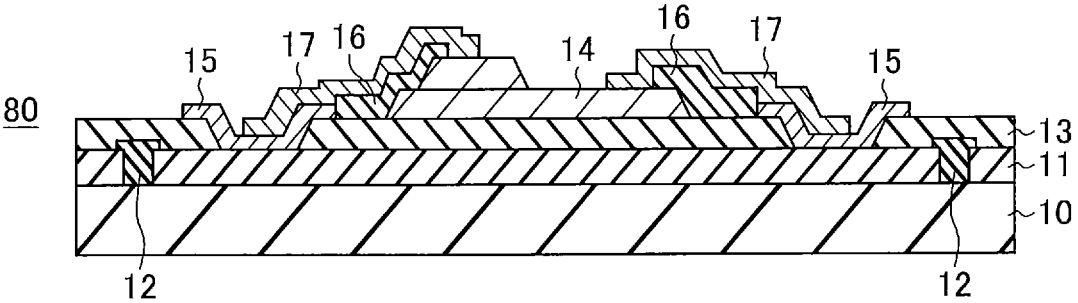

In step SP7, as illustrated in FIGS. 4A and 7C, the apparatus 80 forms insulating films 16 with insulating material such that the insulating films 16 overlap the light emitting elements 14 and the base film 13, and proceeds to the next step SP8. In step SP8, as illustrated in FIGS. 4B and 7D, the apparatus 80 forms wiring portions 17 with conductive material so that the wiring portions 17 overlap the light emitting elements 14, insulating films 16, and connection pads 15, and proceeds to the next step SP9. In steps SP7 and SP8, the apparatus 80 can use methods such as photolithography and vapor deposition.

Figure 4C:
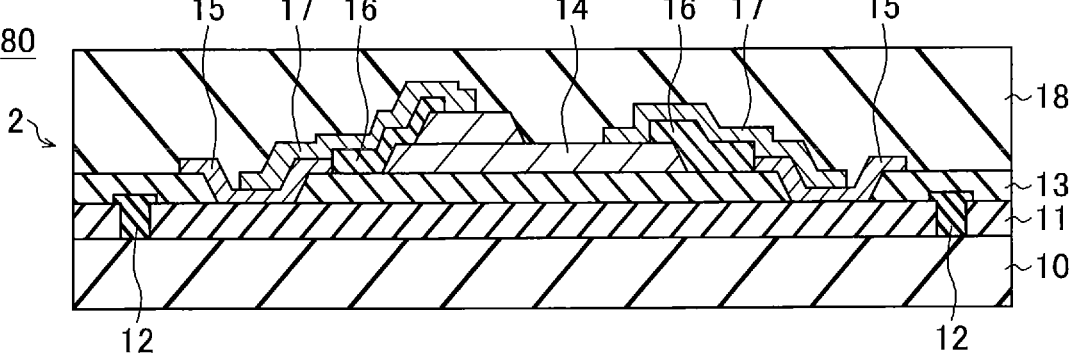

In step SP9, as illustrated in FIGS. 4C and 8A, the apparatus 80 forms a cover layer 18 with organic material such that the cover layer 18 covers the upper side of the base film 13 and the like, thereby completing a composite film 2, and proceeds to the next step SP10. At this time, the composite film 2 is attached to the support layer front surface 11A of the support layer 11.

Figure 4D:
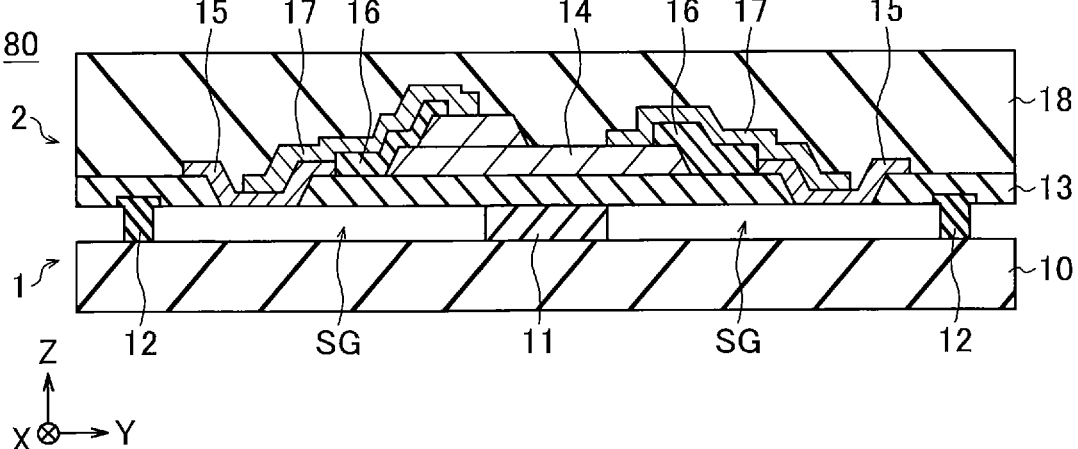

In step SP10, as illustrated in FIGS. 4D and 8B, the apparatus 80 removes part of the support layer 11 to form a support gap SG, and proceeds to the next step SP11. Specifically, the apparatus 80 forms the support gap SG by removing the support layer 11 while leaving a portion of the support layer 11 near a center of the composite film 2, by performing etching using a predetermined chemical liquid (or etchant), such as fluorine or phosphoric acid, that reacts with inorganic material.

At this time, since the micro-spacers 12 are formed by organic material, they are left between the formation substrate 10 and the base film 13 without reacting with the etchant. Thus, the micro-spacers 12 can support, at their respective positions, the portion of the composite film back surface 2B that is not supported by the support layer 11.

As above, the apparatus 80 can manufacture an electronic structure 1 through steps SP1 to SP10. These steps are referred to as a manufacturing step group Q1.

Figure 5A:
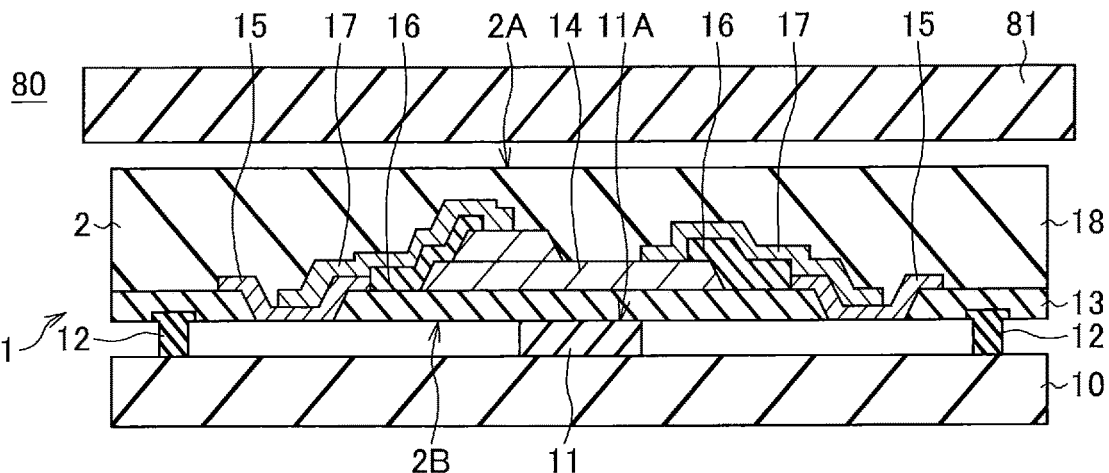
FIGS. 5A to 5C are schematic cross-sectional views illustrating separation and mounting of a composite film according to the first embodiment.

In step SP11, as illustrated in FIG. 5A, the apparatus 80 adheres a stamp 81 having an adhesion function to the composite film front surface 2A, and proceeds to the next step SP12. Here, the electronic structure 1 with the stamp 81 adhering thereto is generally constituted by four types of objects, the formation substrate 10, the support layer 11 and micro-spacers 12, the composite film 2, and the stamp 81, which are sequentially stacked in the Z direction.

The adhesion forces at the three interfaces between the four objects are different in magnitude. As described above, a relatively large adhesion force acts between the formation substrate 10 and the support layer 11, which are both inorganic material. Also, since the stamp 81 is in contact with substantially the entire area of the composite film front surface 2A, a relatively large adhesion force acts between the stamp 81 and the composite film front surface 2A.

On the other hand, a relatively small adhesion force acts between the support layer 11, which is inorganic material, and the base film 13, which is organic material, for the reason that the area of the support layer 11 is sufficiently small, the reason that van der Waals force acts therebetween, and other reasons. Also, since the areas of the flange portions 12F of the micro-spacers 12 are sufficiently small, relatively small adhesion forces act between the micro-spacers 12 and the base film 13.

Figure 5B:
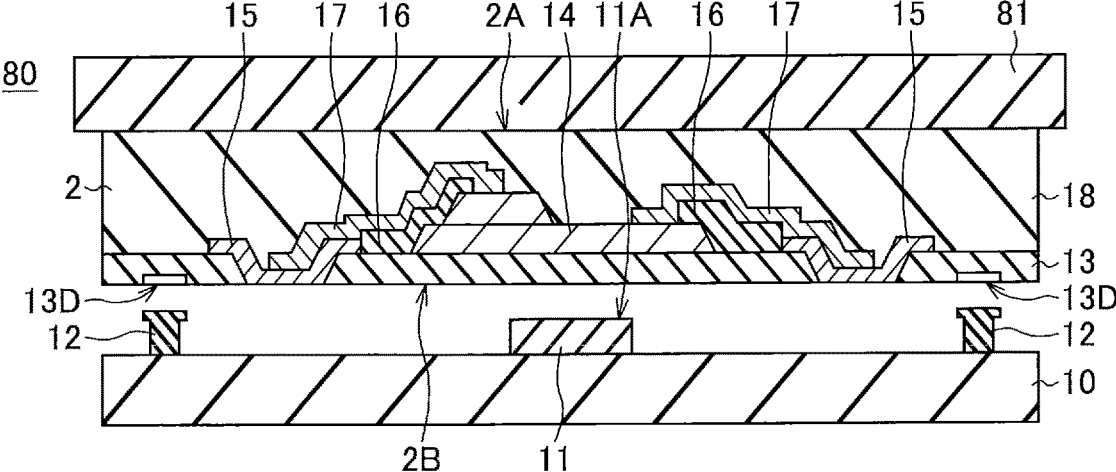

In step SP12, the apparatus 80 moves the stamp 81 in the Z direction while the formation substrate 10 is fixed by a predetermined fixing jig (not illustrated), and proceeds to the next step SP13. Thereby, in the electronic structure 1 with the stamp 81 adhering thereto, as illustrated in FIG. 5B, the base film 13 is separated from the support layer 11 and micro-spacers 12 at the interface where the smallest adhesion force acts, and the composite film 2 is separated from the support layer 11, micro-spacers 12, and formation substrate 10.

In the base film 13 and support layer 11, their respective molecules form structures having sufficient strength. Thus, in the composite film 2, the base film back surface 13B can be kept extremely flat without part of the base film 13 being separated and left on the support layer 11 and part of the support layer 11 being separated and left attached to the base film 13.

As above, the apparatus 80 can separate the composite film 2 of the electronic structure 1 from the formation substrate 10, support layer 11, and micro-spacers 12 through steps SP11 and SP12. These steps are referred to as a separation step group Q2.

Figure 5C:
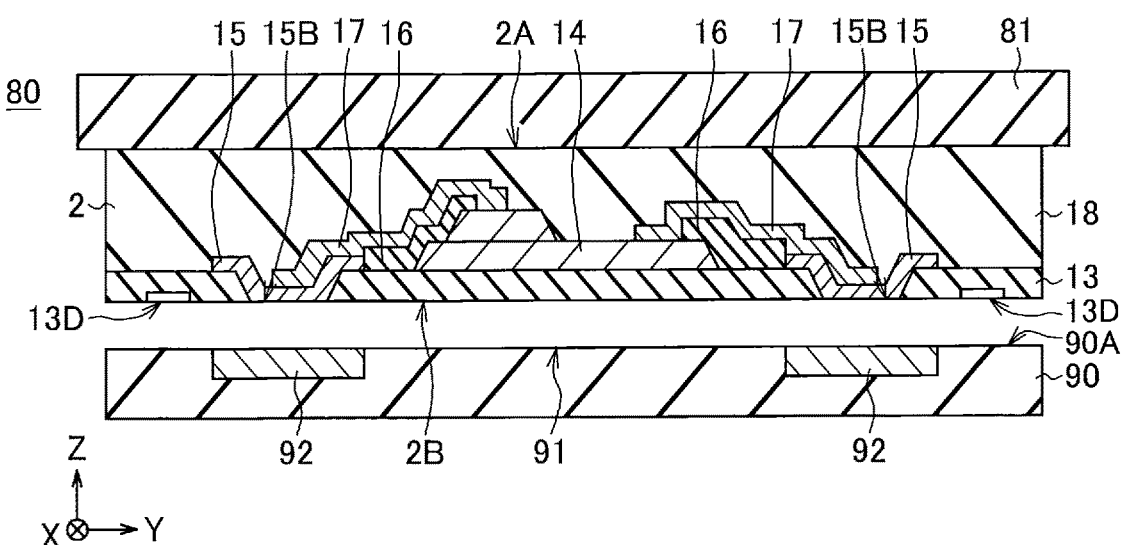

In step SP13, as illustrated in FIG. 5C, the apparatus 80 moves the stamp 81 to locate the composite film 2 on the upper side (or Z direction side) of the wiring substrate 90, and proceeds to the next step SP14.

The wiring substrate 90 is separately manufactured as a circuit substrate consisting primarily of glass epoxy, for example. A mounting portion 91 on which the composite film 2 is to be mounted is set in a wiring substrate front surface 90A (also referred to as a wiring substrate surface) that is a surface of the wiring substrate 90 on the Z direction side. In the mounting portion 91, electrodes 92 are disposed at respective positions corresponding to the respective connection pad back surfaces 15B of the composite film back surface 2B of the composite film 2, and a wiring pattern (not illustrated) is appropriately formed by wiring material. The wiring substrate front surface 90A, which is a front surface of the wiring substrate 90, is formed to be extremely flat, and has a surface roughness of 10 nm or less.

The apparatus 80 positions the composite film back surface 2B at a position slightly away from the mounting portion 91 of the wiring substrate front surface 90A in the Z direction and makes the connection pad back surfaces 15B face the respective electrodes 92, by appropriately moving the stamp 81.

In step SP14, the apparatus 80 attaches the composite film 2 to the wiring substrate 90 by moving the stamp 81 toward the wiring substrate 90, and proceeds to the next step SP15.

Specifically, the apparatus 80 first brings the composite film back surface 2B into contact with the mounting portion 91 of the wiring substrate front surface 90A by moving the stamp 81 in the −Z direction. Thereby, intermolecular forces act between the composite film 2 and the wiring substrate 90, and the composite film 2 can be attached to the mounting portion 91 of the wiring substrate 90.

At this time, the composite film back surface 2B of the composite film 2 and the wiring substrate front surface 90A are both extremely flat, and the entire area of the composite film back surface 2B is in contact with the wiring substrate front surface 90A. Thus, the adhesion force acting between the composite film 2 and the wiring substrate 90 is relatively large, and larger than the adhesion force of the stamp 81.

Then, the apparatus 80 moves the stamp 81 in the Z direction. At this time, the stamp 81 is separated from the composite film 2 due to the difference in magnitude between the adhesion forces. As a result, the apparatus 80 can attach the composite film back surface 2B of the composite film 2 to the wiring substrate front surface 90A of the wiring substrate 90, i.e., mount the composite film 2 to the wiring substrate 90.

As above, the apparatus 80 can mount the composite film 2 on the wiring substrate 90 through steps SP13 and SP14. These steps are referred to as a mounting step group Q3.

In step SP15, the apparatus 80 ends the process RT1. The manufacturing step group Q1 consisting of steps SP1 to SP10, the separation step group Q2 consisting of steps SP11 and SP12, and the mounting step group Q3 consisting of steps SP13 and SP14 are referred to collectively as a manufacturing, separation, and mounting step group Q10.

The above describes a case where the manufacturing step group Q1, separation step group Q2, and mounting step group Q3 of the process RT1 are all performed by the single apparatus 80, i.e., a case where manufacture of the electronic structure 1, and separation and mounting of the composite film 2 are all performed by the single apparatus 80. However, in this embodiment, for example, it is also possible that the manufacturing step group Q1 is performed by a predetermined manufacturing apparatus, and the separation step group Q2 and mounting step group Q3 are performed by a mounting apparatus located at a different place from the manufacturing apparatus. In this case, after the electronic structure 1 is completed through the manufacturing step group Q1, the electronic structure 1 should be transported from the manufacturing apparatus to the mounting apparatus.

1-3. Advantages, Etc

In the above configuration of the electronic structure 1 according to the first embodiment, while the formation substrate 10 and support layer 11 stacked on the lower side are formed by inorganic material, the base film 13 and cover layer 18 of the composite film 2 stacked on the upper side are formed by organic material. Also, in the electronic structure 1, the outer shape of the support layer 11 is formed to be sufficiently smaller than the outer shape of the base film 13 (see FIGS. 1A and 1B).

Thus, in the electronic structure 1, the adhesion force acting between the composite film back surface 2B and the support layer front surface 11A can be made smaller than the adhesion forces at the other interfaces. Thereby, in the electronic structure 1, when a force is applied to the composite film 2 in a direction away from the formation substrate 10, the composite film 2 can be easily separated from the support layer 11 (see FIGS. 5A and 5B).

In particular, in the electronic structure 1, after the formation substrate 10, support layer 11, and composite film 2 are sequentially stacked, the adhesion force acting between the composite film 2 and the support layer 11 is adjusted by removing an outer peripheral portion of the support layer 11 by etching (see FIG. 1B). Thereby, in storage or transportation, the electronic structure 1 can keep adhesion of the composite film 2 to the formation substrate 10 and support layer 11, and keep the composite film back surface 2B smooth without damage thereto.

However, in the electronic structure 1, in order to adjust the adhesion force acting between the composite film 2 and the support layer 11 to an appropriate magnitude, the area of the support layer 11 is made smaller than the area of the composite film back surface 2B. Thus, in the electronic structure 1, the distance from the support layer 11 to an outer peripheral portion of the composite film 2 is relatively large, and the outer peripheral portion of the composite film 2 may droop.

Thus, in the electronic structure 1, the micro-spacers 12 are disposed at multiple positions slightly away from the support layer 11 between the formation substrate 10 and the base film 13 (see FIGS. 1A and 1B, etc.). Thus, in the electronic structure 1, portions of the composite film 2 that are not supported by the support layer 11, e.g., portions near the outer periphery, can be appropriately supported by the respective micro-spacers 12. Thereby, the electronic structure 1 can prevent part of the composite film 2 from drooping in the −Z direction to adhere to the formation substrate 10.

Thus, providing the micro-spacers 12 in the electronic structure 1 makes it possible to reduce the area of the support layer 11 to such a degree that an appropriate adhesion force acts between the composite film 2 and the support layer 11, and keep the composite film 2 away from the formation substrate 10.

For example, in the electronic structure 1, when the composite film 2 has a thickness (or a length in the Z direction) of about 2 μm and the support layer 11 has a thickness of about 1 μm, the composite film back surface 2B can be prevented from adhering to the formation substrate front surface 10A within a range of up to 5 to 10 μm from the upper end of each micro-spacer 12, as viewed in the Z direction.

Also, in the electronic structure 1, the support holes 11H, which are circular holes, are formed in the support layer 11 formed by inorganic material, and filled with organic material for forming the micro-spacers 12 (see steps SP2 and SP3 of FIG. 2, and FIGS. 3B and 3C). Thus, in the electronic structure 1, in the step of removing part of the support layer 11 (see step SP10 of FIG. 2, FIG. 4D, etc.), the micro-spacers 12 can be formed into a desired shape without being dissolved, by only using an etchant that reacts with inorganic material and does not react with organic material.

In the electronic structure 1, if an insufficient amount of organic material is put into a support hole 11H (see FIG. 3B) of the support layer 11, at least part of the upper surface (or the surface on the Z direction side) of the micro-spacer 12 is located below (or on the −Z direction side of) the support layer front surface 11A of the support layer 11. In this case, in the electronic structure 1, when the base film 13 is formed (see FIG. 3D), part of the material enters the support hole 11H, and the base film back surface 13B is formed such that part of the base film back surface 13B projects downward (or in the −Z direction) from its surrounding surface. In this case, after the composite film 2 is separated from the formation substrate 10 and the like (see FIG. 5B), the base film back surface 13B has a portion projecting in the −Z direction from its surrounding surface. This may make the area of contact with the wiring substrate front surface 90A of the wiring substrate 90 (see FIG. 5C) insufficient, making the adhesion force insufficient.

In this respect, in the electronic structure 1, organic material for forming the micro-spacers 12 is put into the support holes 11H of the support layer 11 to such a degree that the organic material slightly overflows from the support holes 11H, and forms the flange portions 12F in the micro-spacers 12 (see FIG. 3C). Thereby, in the electronic structure 1, it is possible to reliably prevent a portion projecting downward (or in the −Z direction) from its surrounding surface from being formed in the base film back surface 13B, and cause a sufficiently large adhesion force to act between the composite film 2 and the wiring substrate 90 (see FIG. 5C).

The recesses 13D (see FIG. 5B) are formed in the composite film back surface 2B of the composite film 2 due to the existence of the flange portions 12F. This reduces the adhesion force to the wiring substrate front surface 90A as compared to a case where the composite film back surface 2B is flat without the recesses 13D. However, since the area of the flange portions 12F is extremely smaller than the area of the entire composite film back surface 2B of the composite film 2 (see FIG. 6C), the reduction in the adhesion force is also slight, and it is possible to make a sufficiently large adhesion force act between the composite film back surface 2B and the wiring substrate front surface 90A.

Also, in the electronic structure 1, while the base film 13 and cover layer 18 of the composite film 2, which are eventually useful, are formed by organic material, the formation substrate 10 and support layer 11, which eventually become useless, are formed by inorganic material. Thus, in the electronic structure 1, in the step of performing etching, by using an appropriate etchant, it is possible to remove part of the inorganic material almost without damaging the organic material, i.e., etch the inorganic material with high etching selectivity.

In the electronic structure 1, at the interface between the support layer 11 and the base film 13, where the composite film 2 is separated in the later step, the organic material and the inorganic material are in contact with each other, and thus the adhesion force therebetween is relatively small. Thus, in the electronic structure 1, it is possible to successfully separate the base film 13 from the support layer 11 in the separation step group Q2 (see FIGS. 2 and 5A to 5C) by only moving the composite film front surface 2A away from the formation substrate 10, and make the composite film back surface 2B extremely flat.

Moreover, in the manufacturing process of the electronic structure 1, the front surface of the formation substrate 10 is formed to be extremely smooth, and the support layer front surface 11A of the support layer 11 is also formed thereon to be extremely smooth. Thus, the base film back surface 13B of the base film 13, which is formed thereon, is also formed to be extremely smooth.

Thus, the electronic structure 1 can provide the composite film 2 with the composite film back surface 2B extremely flat when the composite film 2 is separated from the formation substrate 10 and support layer 11. Thus, by only attaching the composite film 2 separated from the electronic structure 1 to the wiring substrate front surface 90A of the wiring substrate 90, it is possible to generate a sufficiently large adhesion force and obtain sufficient conductivity.

Moreover, in the manufacturing process of the electronic structure 1, the formation substrate 10 is formed such that its front surface is extremely flat, and the other portions are sequentially stacked on the front surface of the formation substrate 10 (see FIGS. 3A to 3F and 4A to 4D). Thus, the electronic structure 1 can be easily manufactured such that the composite film back surface 2B is extremely flat, i.e., the base film back surface 13B and connection pad back surfaces 15B are all extremely flat, and the steps between the base film back surface 13B and the connection pad back surfaces 15B are extremely small, without having to adding a step for planarizing the composite film back surface 2B.

In the electronic structure 1, the composite film back surface 2B can be formed to be extremely smooth through a significantly simple process, as compared to a case of forming anchors on a lower surface of the composite film as in Japanese Patent Application Publication No. 2017-108160 and removing the anchors to planarize the composite film.

Also, in the electronic structure 1, the connection pads 15 are formed by metal material such as gold (Au) or platinum (Pt) having conductivity and extremely low ionization tendency. Thus, in the electronic structure 1, in the etching process for removing part of the support layer 11, even when the etchant contacts the connection pads 15, the degree of damage to the surfaces of the connection pads 15 can be extremely reduced, and the surfaces of the connection pads 15 can be kept smooth.

An adhesive may be used to adhere two objects together. The adhesive may be one that exhibits an adhesive property using intermolecular forces. Also, the adhesive is typically liquid, and the two objects are bonded together by applying the adhesive to adherend surfaces of the two objects and hardening the adhesive between the two objects. When such an adhesive is used, in order to separate the bonded objects from each other, the hardened adhesive needs to be physically broken. At this time, the objects may be damaged.

Also, bump bonding is often used to electrically connect two electrodes, such as an electrode of a wiring substrate and an electrode of an element. In bump bonding, an alloy is formed by eutectic reaction between the electrodes. In this case, the bonding can be broken by, for example, laser removal. However, this damages the electrodes, especially the electrode of the wiring substrate.

On the other hand, in this embodiment, without using such an adhesive, physical and electrical connections are achieved by bringing the composite film back surface 2B of the composite film 2 into direct contact with the wiring substrate front surface 90A of the wiring substrate 90 to cause intermolecular forces to act directly between the two surfaces. Thus, in this embodiment, when a defect is detected after the composite film 2 is mounted on the wiring substrate 90, it is possible to separate the composite film 2 extremely easily almost without damaging the wiring substrate 90, and attach a new composite film 2 to the same portion.

As described above, the electronic structure 1 according to the first embodiment has a configuration in which the support layer 11 is stacked on the formation substrate 10, the composite film 2 is further stacked thereon, the support layer 11 has an area smaller than an area of the composite film 2, and the multiple micro-spacers 12 are disposed. Thus, in the electronic structure 1, it is possible to appropriately adjust the adhesion force acting between the composite film 2 and the support layer 11 so that the composite film 2 is not separated in storage and transportation and can be easily separated with the stamp 81 before mounting, and to prevent the composite film back surface 2B from adhering to the formation substrate 10. Thus, the electronic structure 1 can be easily stored or transported while maintaining the smoothness of the composite film back surface 2B, and facilitate separation of the composite film 2 from the support layer 11 and mounting of the composite film 2 to the wiring substrate 90.

In the present disclosure, at the interface between the functional element unit and the support, their constituent materials are different in properties, and the area of the third surface of the support is smaller than the area of the second surface. This can make the adhesion force acting between the functional element unit and the support relatively small. In addition, the projections support the functional element unit together with the support. This can prevent the functional element unit from adhering to the first surface of the substrate. Moreover, the projections are formed by a different material from the support. This makes it possible to form the projections into a desired shape by taking advantage of the difference in properties between the materials.

2. Second Embodiment

Figure 9A:
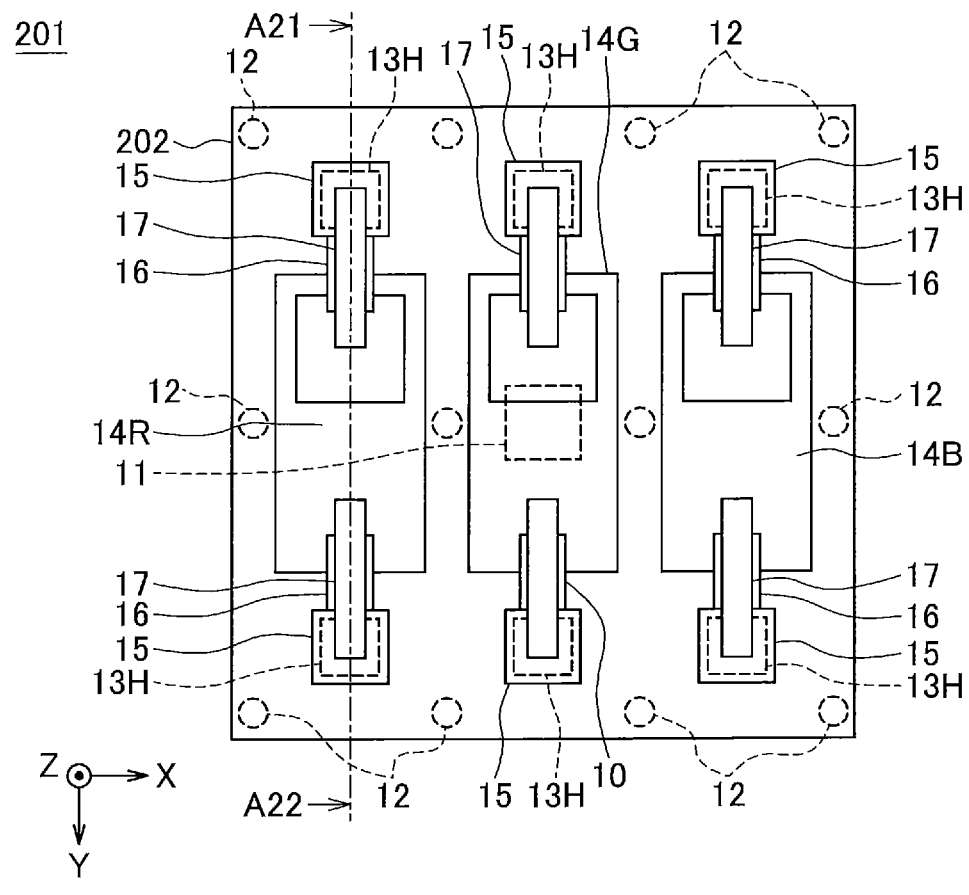
FIGS. 9A and 9B are a schematic plan view and a schematic cross-sectional view illustrating a configuration of an electronic structure according to a second embodiment.
Figure 9B:
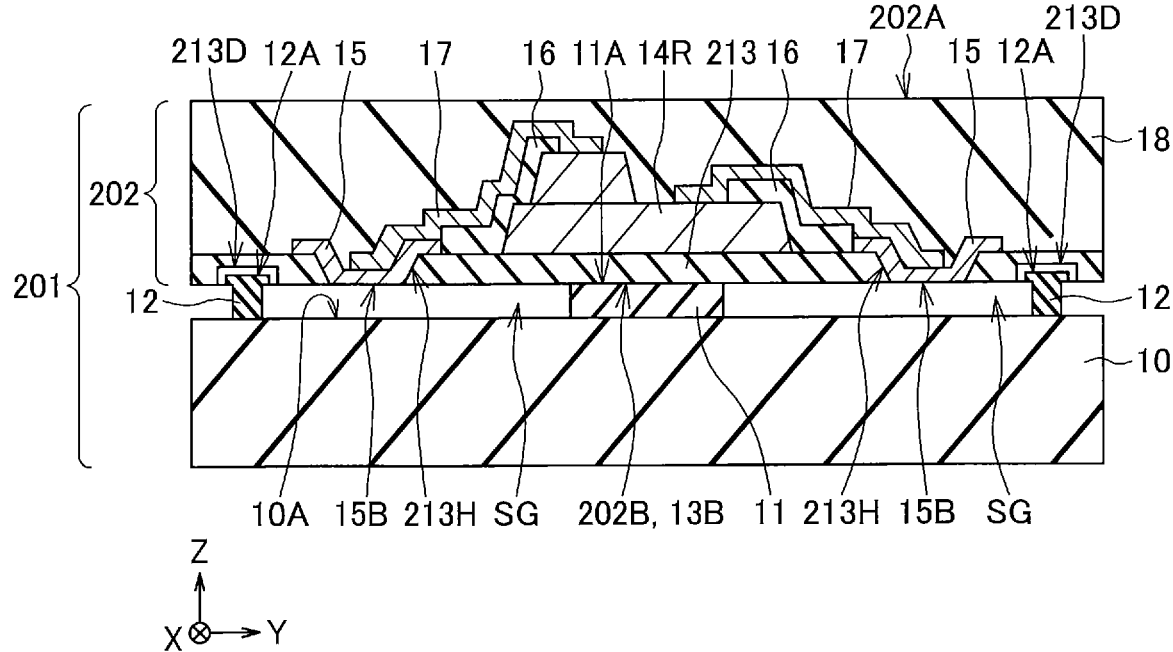
Figure 10:
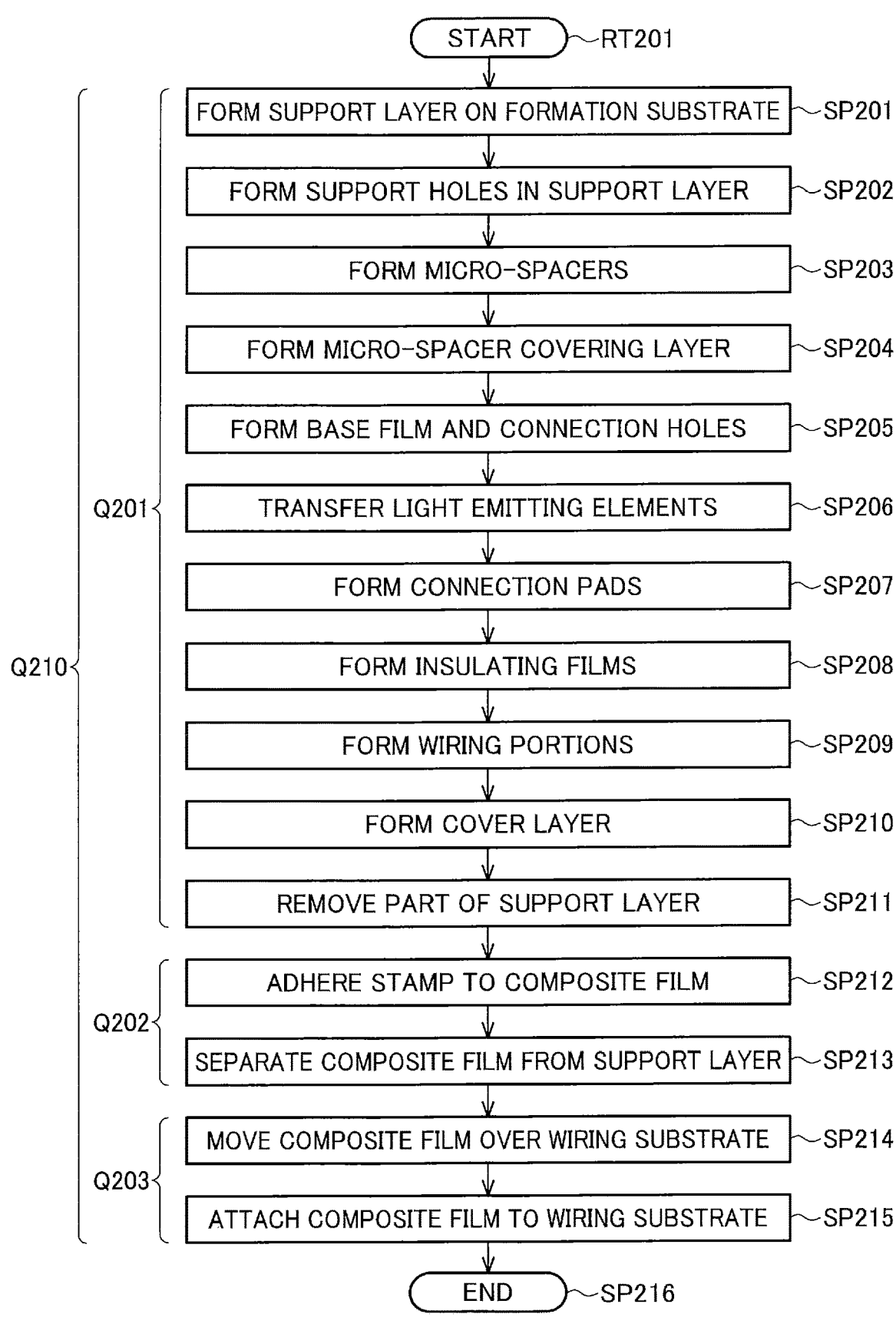
FIG. 10 is a flowchart illustrating a manufacturing, separation, and mounting process according to the second embodiment.

FIG. 9A, corresponding to FIG. 1A, is a schematic plan view illustrating configurations of an electronic structure 201 and a composite film 202 according to a second embodiment. FIG. 9B, corresponding to FIG. 1B, is a schematic cross-sectional view illustrating a cross-section taken along line A21-A22 of FIG. 9A. In the second embodiment, X, Y, and Z directions are defined in the same manner as in the first embodiment.

The electronic structure 201 is different from the electronic structure 1 according to the first embodiment in having the composite film 202 instead of the composite film 2, but otherwise the same. The composite film 202 is different from the composite film 2 according to the first embodiment in having a base film 213 instead of the base film 13, but otherwise the same.

The base film 213 is different from the base film 13 of the first embodiment in having recesses 213D instead of the recesses 13D, but otherwise the same. The recesses 213D are formed to be slightly larger than the recesses 13D. The recesses 213D are also referred to as protector recesses.

In the electronic structure 1 (see FIG. 1B) according to the first embodiment, surfaces forming inner surfaces of the recesses 13D have substantially the same shapes as surfaces forming the micro-spacer front surfaces 12A. Thus, in the electronic structure 1, the recesses 13D are in close contact with the micro-spacer front surfaces 12A over substantially the entire areas of the recesses 13D.

On the other hand, in the electronic structure 201 (see FIG. 9B) according to the second embodiment, surfaces forming inner surfaces of the recesses 213D have larger diameters than surfaces forming the micro-spacer front surfaces 12A. Thus, in the electronic structure 201, the recesses 213D are spaced upward from the micro-spacer front surfaces 12A, or are in contact with part of the micro-spacer front surfaces 12A with part of the composite film 202 drooping due to gravity. Thus, in the electronic structure 201, the micro-spacer front surfaces 12A are located in the recesses 213D, and gaps are formed between the recesses 213D and the micro-spacer front surfaces 12A.

Next, manufacture of the electronic structure 201, and separation and mounting of the composite film 202 will be described with reference to FIGS. 10, 11A to 11G, 12A to 12D, and 13A to 13C, respectively corresponding to FIGS. 2, 3A to 3F, 4A to 4D, and 5A to 5C.

The electronic structure 201 is manufactured by a manufacturing, separation, and mounting apparatus 280, corresponding to the apparatus 80 of the first embodiment, by stacking multiple layers on the formation substrate 10 in a stepwise manner. Then, the composite film 202 is separated from the support layer 11 and micro-spacers 12, and mounted to a wiring substrate 90, by the apparatus 280.

Specifically, upon starting a manufacturing, separation, and mounting process RT201 (see FIG. 10), in steps SP201, SP202, and SP203, the apparatus 280 performs the same processes as in steps SP1, SP2, and SP3 (see FIG. 2) of the first embodiment, respectively, and proceeds to the next step SP204. Thereby, the apparatus 280 forms a support layer 11 on a formation substrate front surface 10A of a formation substrate 10, forms support holes 11H at multiple positions in the support layer 11, and forms multiple micro-spacers 12 (see FIGS. 11A, 11B, and 11C).

Figures 11A, 11B, 11C, 11D, 11E, 11F, 11G:
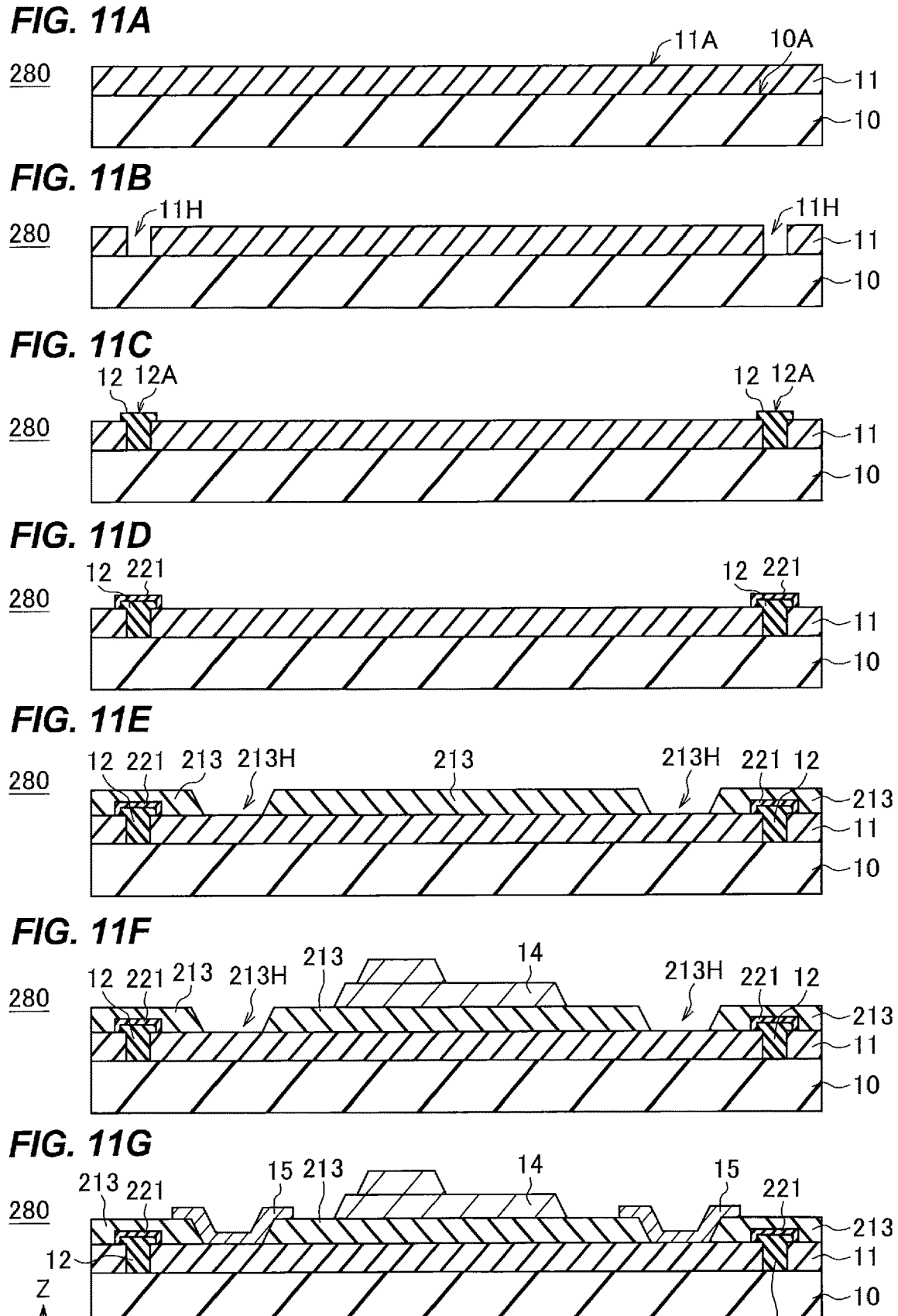
FIGS. 11A to 11G are schematic cross-sectional views illustrating manufacture of the electronic structure according to the second embodiment.

In step SP204, as illustrated in FIG. 11D, the apparatus 280 forms a covering layer 221 over (on the Z direction side of) each micro-spacer 12, and proceeds to the next step SP205. Specifically, for each micro-spacer 12, the apparatus 280 deposits an inorganic material that is the same as that of the support layer 11, in the form of a layer, in an area that encompasses the flange portion 12F of the micro-spacer 12 and is slightly larger than the flange portion 12F, by a known process such as lithography.

Figure 12A:
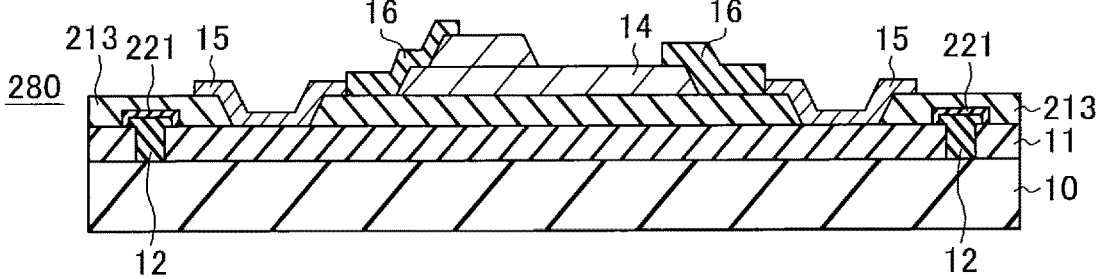
FIGS. 12A to 12D are schematic cross-sectional views illustrating manufacture of the electronic structure according to the second embodiment.
Figure 12B:
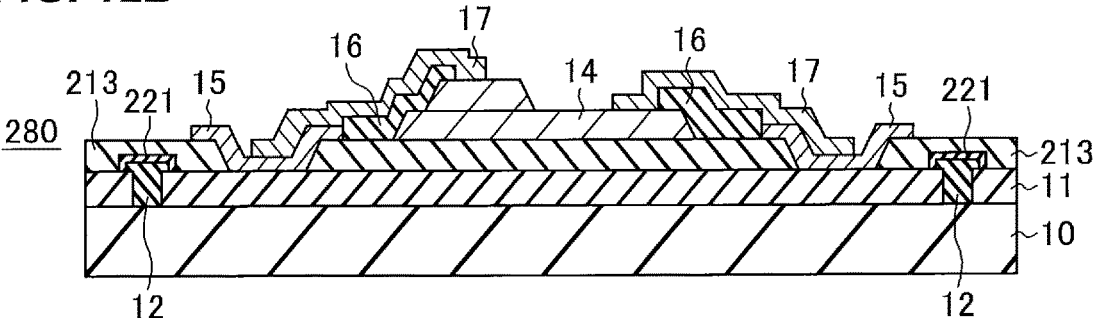
Figure 12C:
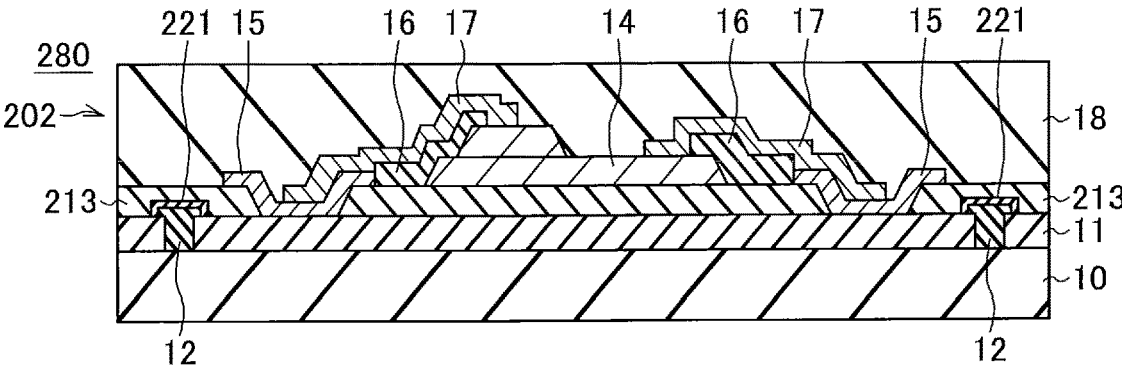
Figure 12D:
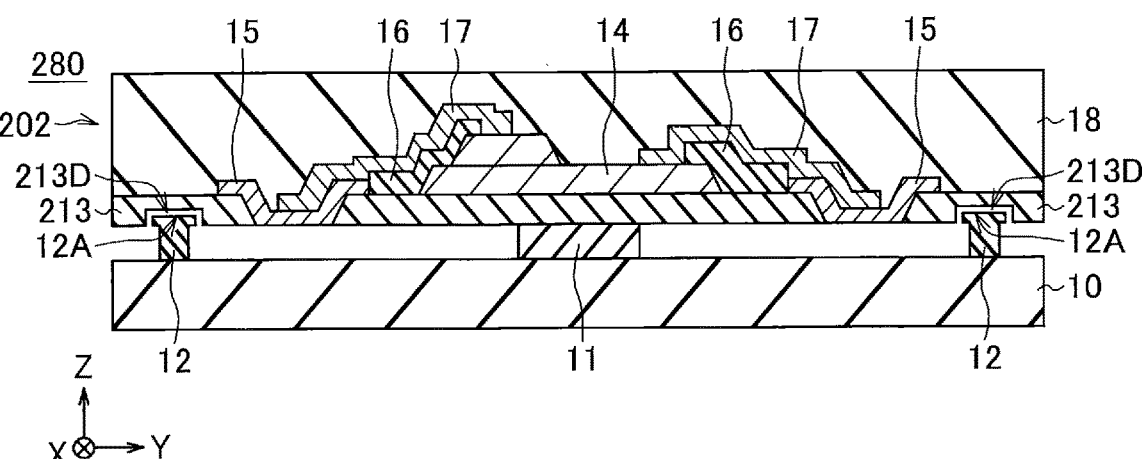
Figure 13A:
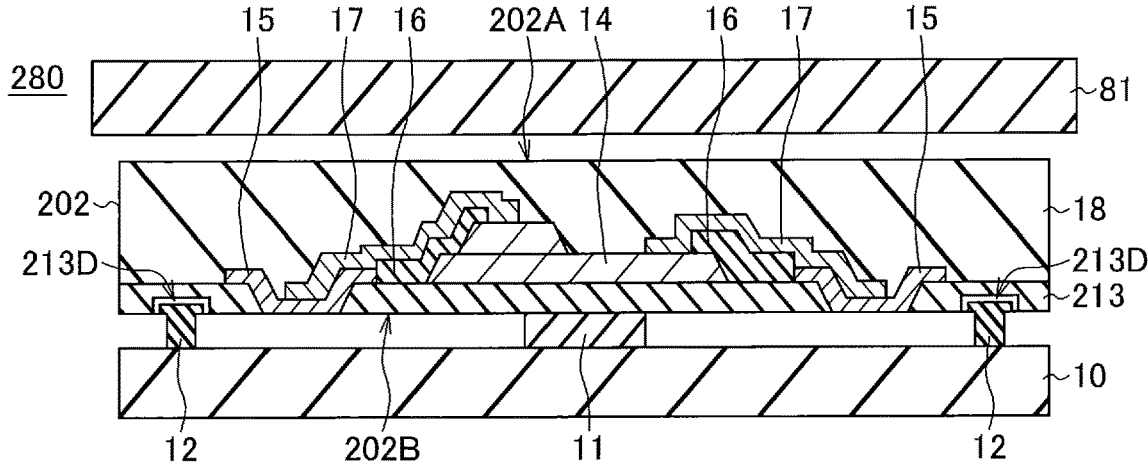
FIGS. 13A to 13C are schematic cross-sectional views illustrating separation and mounting of a composite film according to the second embodiment.
Figure 13B:
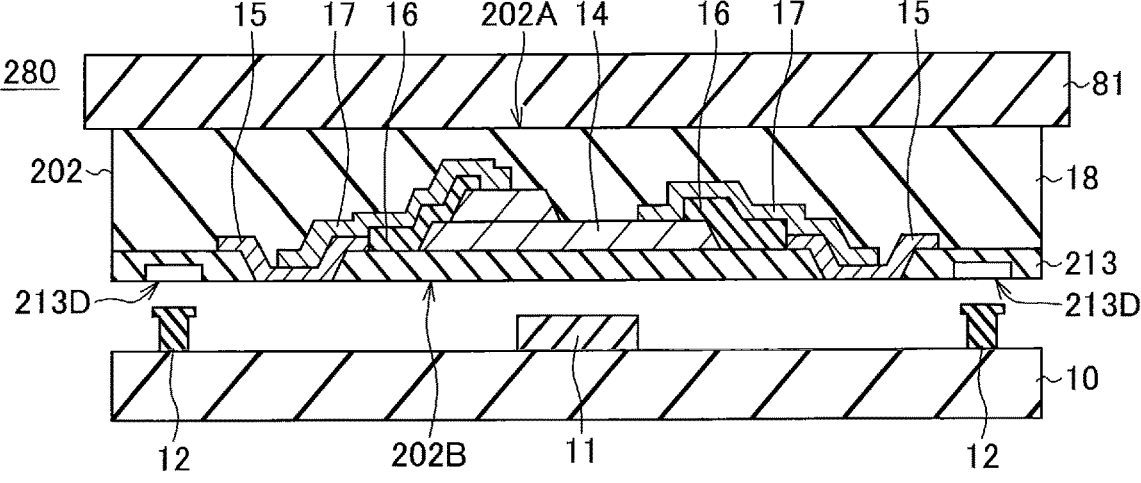
Figure 13C:
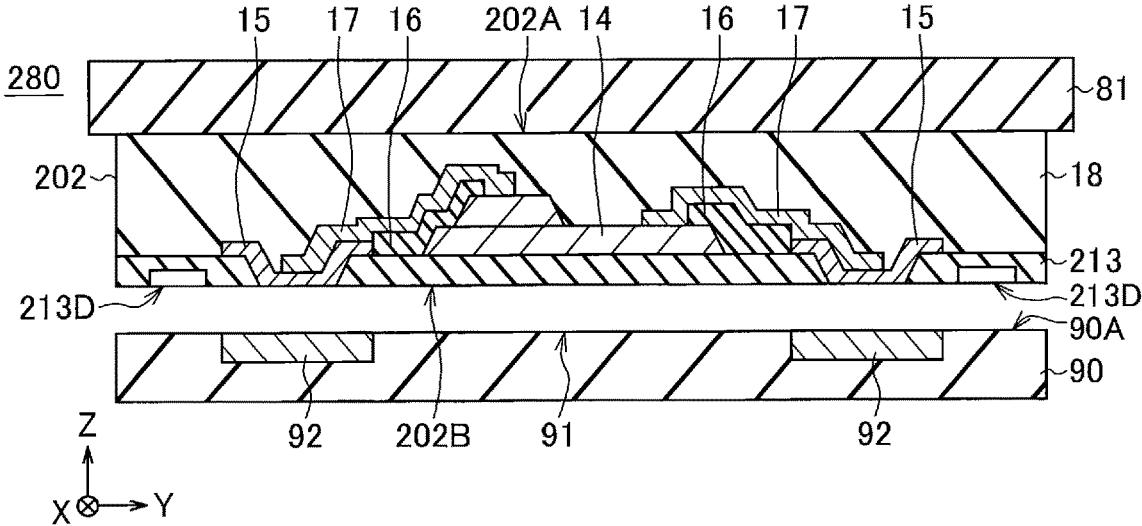

Then, in steps SP205 to SP211 (see FIG. 10), the apparatus 280 performs the same processes as in steps SP4 to SP10 (see FIG. 2) of the first embodiment, respectively, thereby manufacturing an electronic structure 201, and proceeds to the next step SP212. At this time, in step SP211, as illustrated in FIG. 12D, the apparatus 280 removes part of the support layer 11 to form a support gap SG and simultaneously removes the covering layers 221, by performing etching using a predetermined chemical liquid (or etchant). Thereby, in the electronic structure 201, gaps are formed between the recesses 213D of the base film 213 and the micro-spacer front surfaces 12A. Specifically, each recess 213D is away from the corresponding micro-spacer front surface 12A or in contact with part of the corresponding micro-spacer front surface 12A. In the electronic structure 201, the micro-spacer front surfaces 12A are located inside the recesses 213D.

In this manner, the apparatus 280 of the second embodiment can manufacture the electronic structure 201 through steps SP201 to SP211. These steps are referred to as a manufacturing step group Q201.

After that, in steps SP212 to SP215, the apparatus 280 performs the same processes as in steps SP11 to SP14 of the first embodiment, respectively, thereby separating the composite film 202 from the formation substrate 10 and the like and mounting the composite film 202 to a wiring substrate 90. Steps SP212 and SP213 are referred to as a separation step group Q202, and steps SP214 and SP215 are referred to as a mounting step group Q203.

In step SP216, the apparatus 280 ends the process RT201. The manufacturing step group Q201 consisting of steps SP201 to SP211, the separation step group Q202 consisting of steps SP212 and SP213, and the mounting step group Q203 consisting of steps SP214 and SP215 are referred to collectively as a manufacturing, separation, and mounting step group Q210.

In the above configuration of the electronic structure 201 according to the second embodiment, the micro-spacers 12 are disposed at multiple positions slightly away from the support layer 11, between the formation substrate 10 and the base film 213 (see FIGS. 9A and 9B, etc.), similarly to the first embodiment. Thereby, in the electronic structure 201, the portion of the composite film 202 that is not supported by the support layer 11 can be appropriately supported by the micro-spacers 12 and prevented from drooping in the –Z direction to adhere to the formation substrate 10, similarly to the first embodiment.

In addition, in the electronic structure 201, gaps are formed between the recesses 213D of the base film 213 and the upper surfaces of the micro-spacers 12. Specifically, each recess 213D is away from the upper surface of the corresponding micro-spacer 12 or in contact with part of the upper surface of the corresponding micro-spacer 12. Thereby, in the electronic structure 201, when the composite film 202 is separated from the formation substrate 10 and the like (see FIG. 13B), the micro-spacers 12 can be easily separated from a composite film back surface 202B, and reliably prevented from being undesirably separated from the formation substrate 10.

Also, in the electronic structure 201, the covering layers 221 covering the upper surfaces of the micro-spacers 12 are formed by an inorganic material that is the same as that of the support layer 11 in the manufacturing process of the electronic structure 201 (see FIG. 11D). Thus, as compared to the first embodiment, although the electronic structure 201 requires an additional step to dispose the covering layers 221, it requires no additional step to remove the covering layers 221 since the covering layers 221 can be removed together with part of the support layer 11 by etching.

In other respects, the electronic structure 201 according to the second embodiment can provide the same effects and advantages as the electronic structure 1 according to the first embodiment.

3. Third Embodiment

Figure 14A:
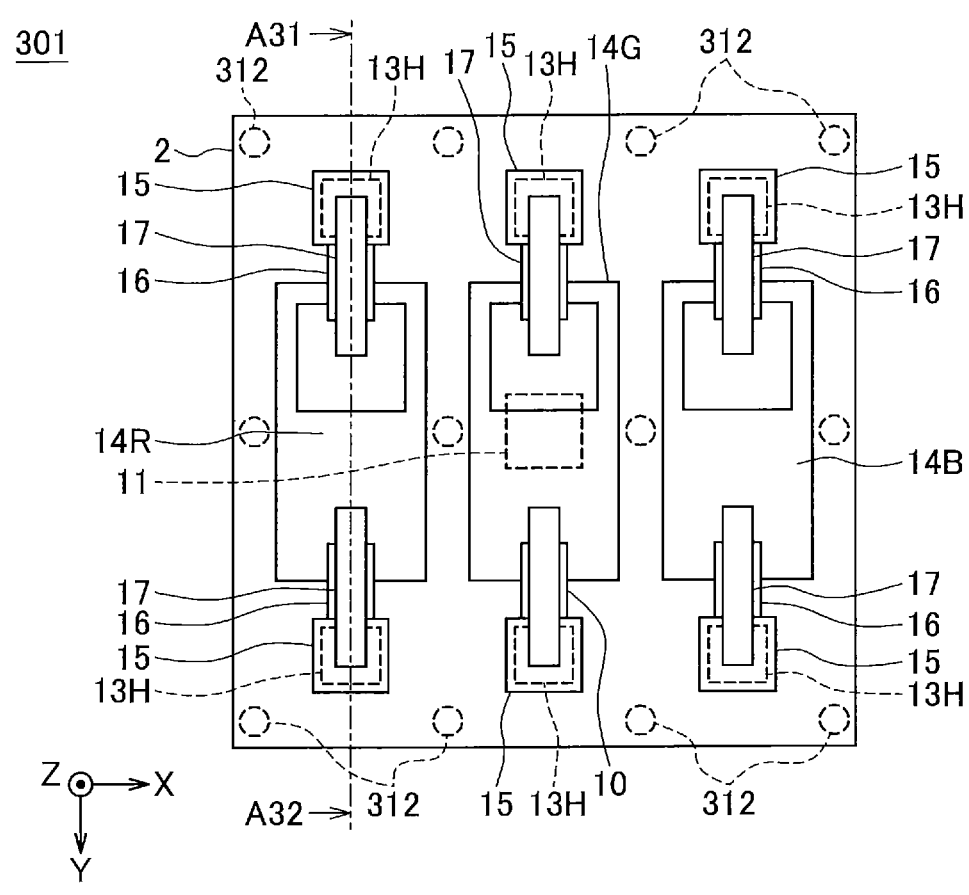
FIGS. 14A and 14B are a schematic plan view and a schematic cross-sectional view illustrating a configuration of an electronic structure according to a third embodiment.
Figure 14B:
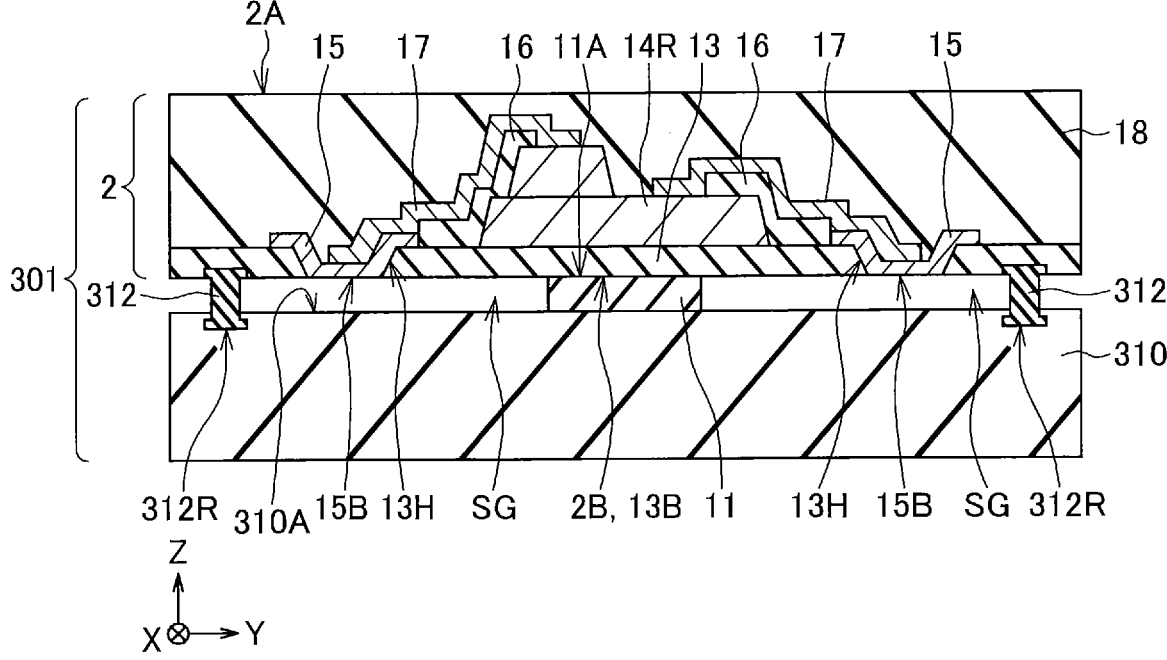
Figure 15:
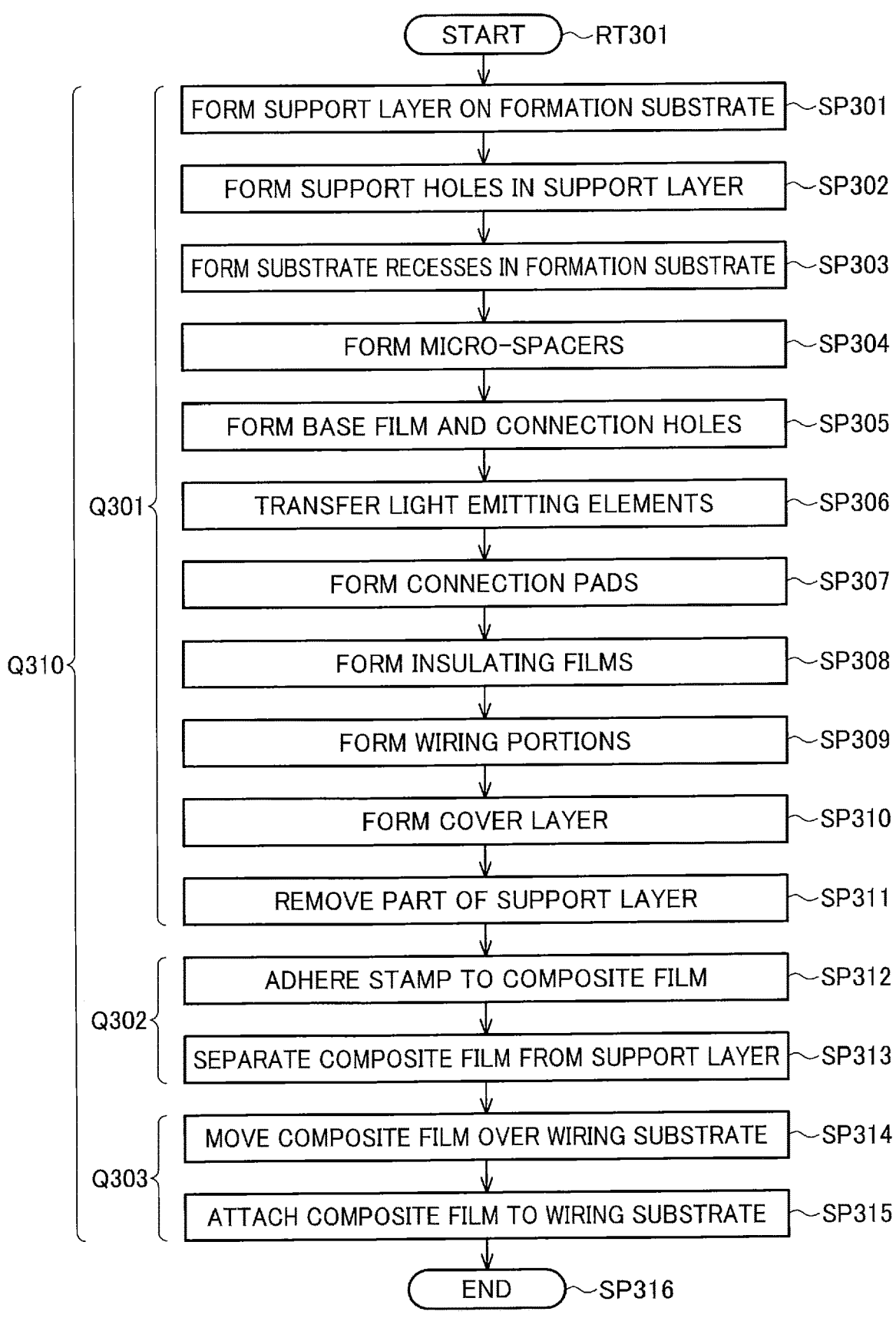
FIG. 15 is a flowchart illustrating a manufacturing, separation, and mounting process according to the third embodiment.

FIG. 14A, corresponding to FIG. 1A, is a schematic plan view illustrating configurations of an electronic structure 301 and a composite film 2 according to a third embodiment. FIG. 14B, corresponding to FIG. 1B, is a schematic cross-sectional view illustrating a cross-section taken along line A31-A32 of FIG. 14A. In the third embodiment, X, Y, and Z directions are defined in the same manner as in the first embodiment.

The electronic structure 301 is different from the electronic structure 1 according to the first embodiment in having a formation substrate 310 and micro-spacers 312 instead of the formation substrate 10 and micro-spacers 12, but otherwise the same. The formation substrate 310 is different from the formation substrate 10 of the first embodiment in that for each micro-spacer 312, a substrate recess 310D is formed at a position where the micro-spacer 312 is disposed, but otherwise the same.

The micro-spacers 312 are different from the micro-spacers 12 of the first embodiment in that the micro-spacers 312 have roots 312R below (or on the –Z direction side of)

a formation substrate front surface 310A of the formation substrate 310, and the roots 312R are located in the substrate recesses 310D, but otherwise the same.

Next, manufacture of the electronic structure 301, and separation and mounting of the composite film 2 will be described with reference to FIGS. 15, 16A to 16G, 17A to 17D, and 18A to 18C, respectively corresponding to FIGS. 2, 3A to 3F, 4A to 4D, and 5A to 5C.

The electronic structure 301 is manufactured by a manufacturing, separation, and mounting apparatus 380, corresponding to the apparatus 80 of the first embodiment, by stacking multiple layers on the formation substrate 310 in a stepwise manner. Then, the composite film 2 is separated from the support layer 11 and micro-spacers 312, and mounted to a wiring substrate 90, by the apparatus 380.

Specifically, upon starting a manufacturing, separation, and mounting process RT301 (see FIG. 15), in steps SP301 and SP302, the apparatus 380 performs the same processes as in steps SP1 and SP2 of the first embodiment, respectively, and proceeds to the next step SP303. Thereby, the apparatus 380 forms a support layer 11 on a formation substrate front surface 310A of a formation substrate 310, and forms support holes 11H at multiple positions in the support layer 11 (see FIGS. 16A and 16B).

Figures 16A, 16B, 16C, 16D, 16E, 16F, 16G:
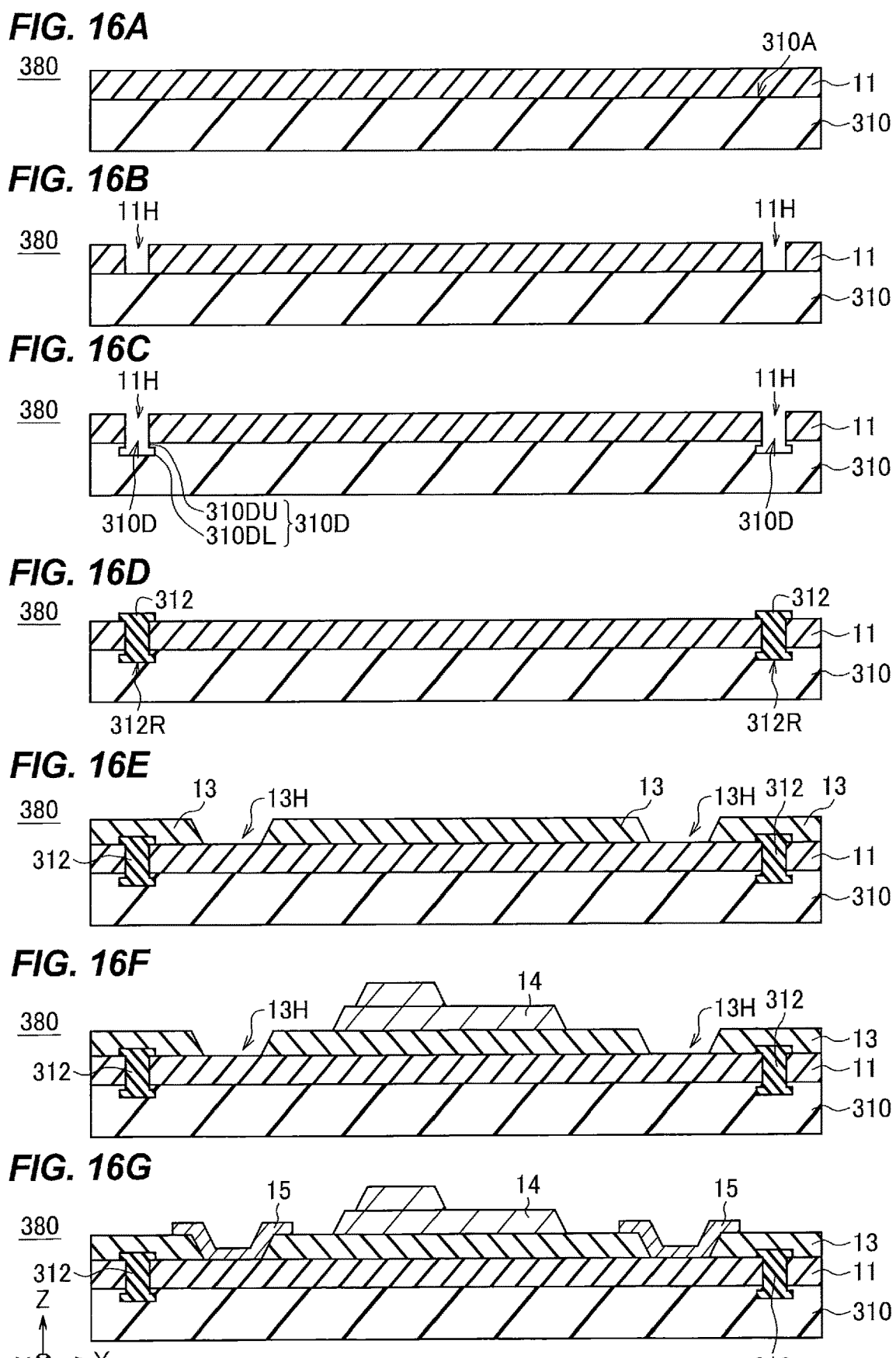
FIGS. 16A to 16G are schematic cross-sectional views illustrating manufacture of the electronic structure according to the third embodiment.
Figure 17A:
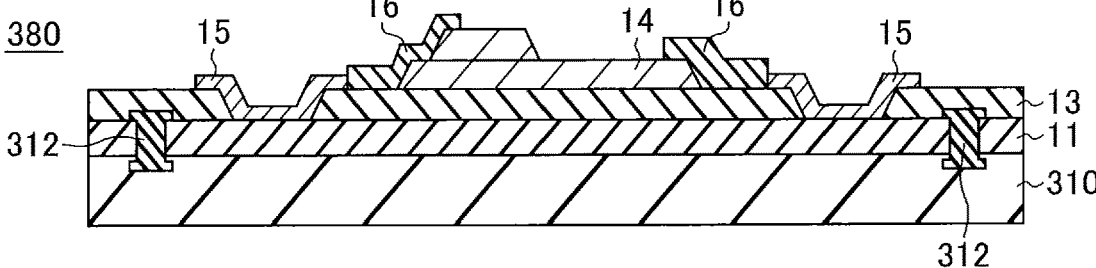
FIGS. 17A to 17D are schematic cross-sectional views illustrating manufacture of the electronic structure according to the third embodiment.
Figure 17B:
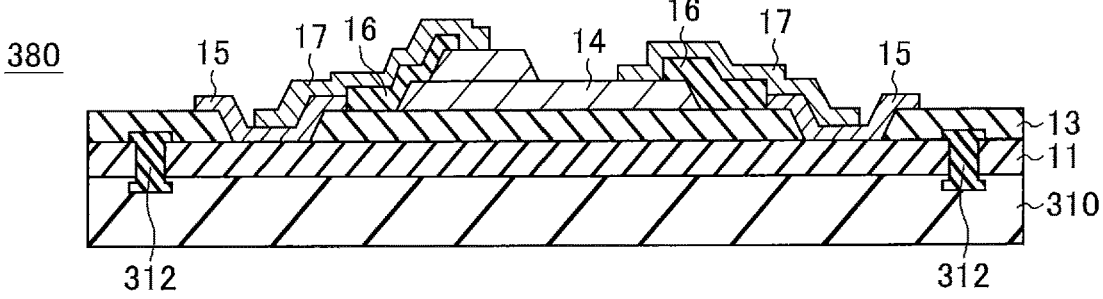
Figure 17C:
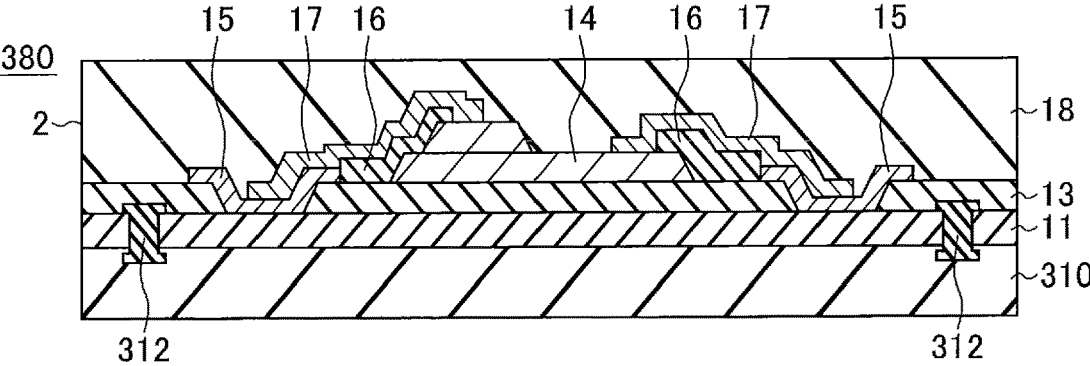
Figure 17D:
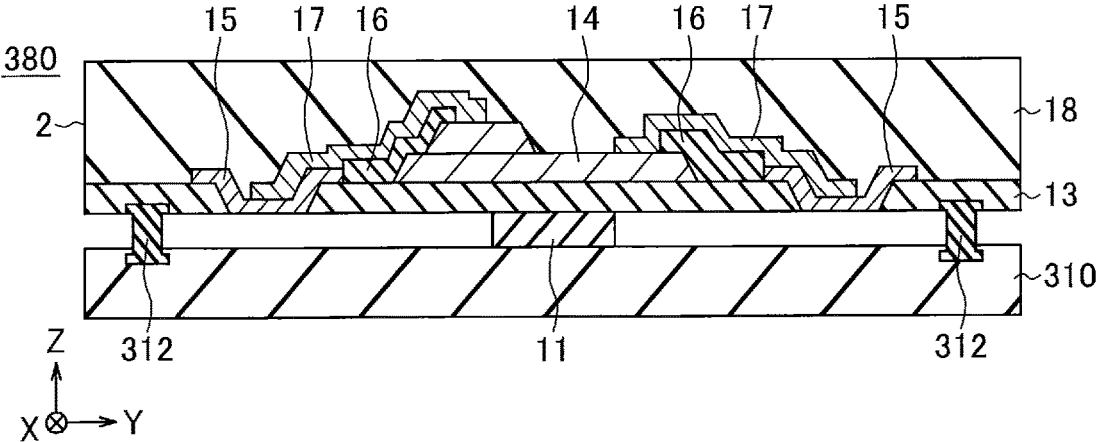
Figure 18A:
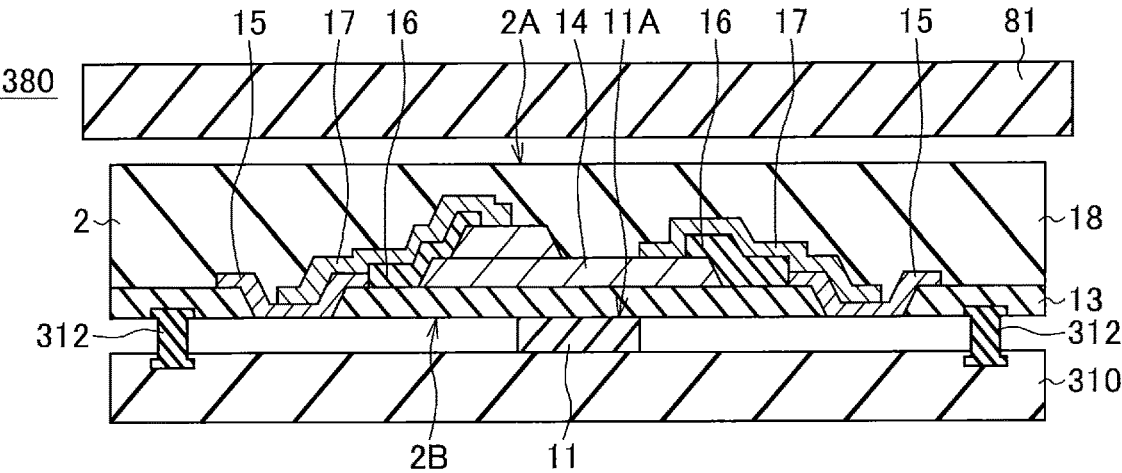
FIGS. 18A to 18C are schematic cross-sectional views illustrating separation and mounting of a composite film according to the third embodiment.
Figure 18B:
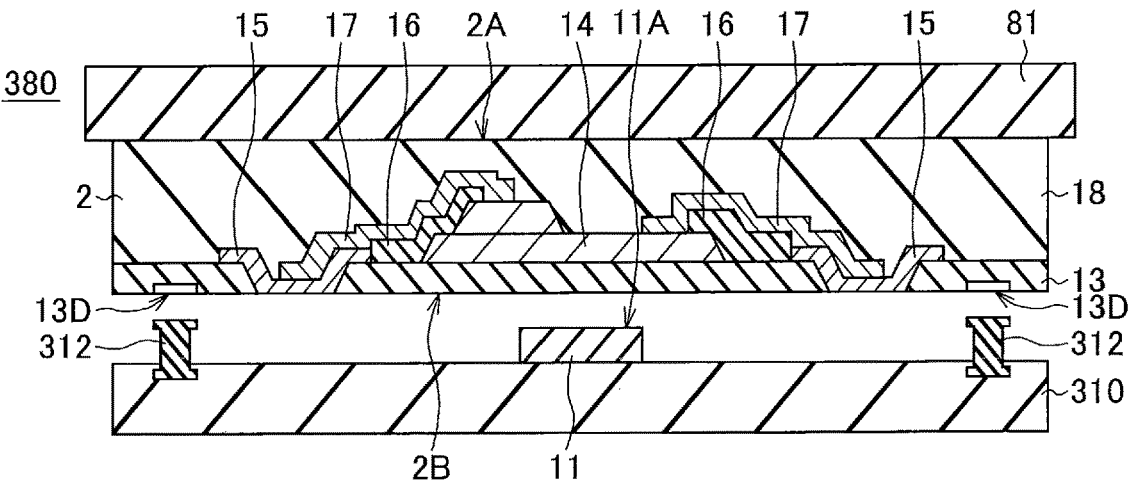
Figure 18C:
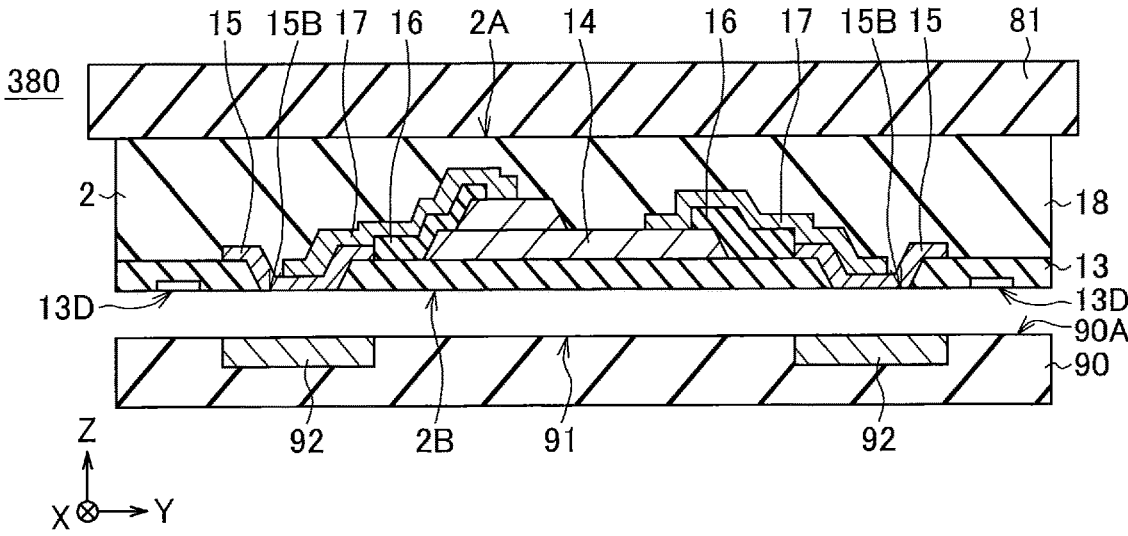

In step SP303, as illustrated in FIG. 16C, the apparatus 380 forms a substrate recess 310D under each support hole 11H in the formation substrate 310 by etching, and proceeds to the next step SP304. Thereby, each support hole 11H becomes a space communicating with the substrate recess 310D formed under the support hole 11H.

Each substrate recess 310D formed at this time has an upper substrate recess portion 310DU located near the formation substrate front surface 310A, and a lower substrate recess portion 310DL located below the upper substrate recess portion 310DU. A diameter of the lower substrate recess portion 310DL in an imaginary cross-section parallel to an XY plane is larger than a diameter of the upper substrate recess portion 310DU in an imaginary cross-section parallel to the XY plane. For example, the substrate recess 310D has a diameter of about 5.1 μm in the upper substrate recess portion 310DU, and a diameter of about 6.1 μm in the lower substrate recess portion 310DL. The upper substrate recess portion 310DU is also referred to as a first substrate recess portion, and the lower substrate recess portion 310DL is also referred to as a second substrate recess portion.

In step SP304, as illustrated in FIG. 16D, the apparatus 380 forms micro-spacers 312 by depositing organic material at positions of the support holes 11H in the same manner as in step SP3 of the first embodiment, and proceeds to the next step SP305. At this time, the apparatus 380 fills not only the support holes 11H but also the substrate recesses 310D with organic material, thereby forming roots 312R in the micro-spacers 312. For each root 312R, an outer diameter of a lower portion of the root 312R located in the lower substrate recess portion 310DL is larger than an outer diameter of an upper portion of the root 312R located above the lower portion. Also, the organic material protrudes around the support holes 11H to form flange portions 312F in the micro-spacers 312, in the same manner as in the first embodiment.

Then, in steps SP305 to SP311 (see FIG. 15), the apparatus 380 performs the same processes as in steps SP4 to SP10 (see FIG. 2) of the first embodiment, respectively, thereby manufacturing an electronic structure 301, and proceeds to the next step SP312.

In this manner, the apparatus 380 of the third embodiment can manufacture the electronic structure 301 through steps SP301 to SP311. These steps are referred to as a manufacturing step group Q301.

After that, in steps SP312 to SP315, the apparatus 380 performs the same processes as in steps SP11 to SP14 of the first embodiment, respectively, thereby separating the composite film 2 from the formation substrate 310 and the like and mounting the composite film 2 to a wiring substrate 90. Steps SP312 and SP313 are referred to as a separation step group Q302, and steps SP314 and SP315 are referred to as a mounting step group Q303.

In step SP316, the apparatus 380 ends the process RT301. The manufacturing step group Q301 consisting of steps SP301 to SP311, the separation step group Q302 consisting of steps SP312 and 313, and the mounting step group Q303 consisting of steps SP314 and SP315 are referred to collectively as a manufacturing, separation, and mounting step group Q310.

In the above configuration of the electronic structure 301 according to the third embodiment, the micro-spacers 312 are disposed at multiple positions slightly away from the support layer 11, between the formation substrate 310 and the base film 13 (see FIGS. 14A and 14B, etc.), similarly to the first embodiment. Thereby, in the electronic structure 301, the portion of the composite film 2 that is not supported by the support layer 11 can be appropriately supported by the micro-spacers 312 and prevented from drooping in the −Z direction to adhere to the formation substrate 10, similarly to the first embodiment.

In addition, in the electronic structure 301, the substrate recesses 310D are provided in the formation substrate 310, and the roots 312R of the micro-spacers 312 are formed in the substrate recesses 310D. Thereby, in the electronic structure 301, when the composite film 2 is separated from the formation substrate 310 and the like (see FIG. 18B), the micro-spacers 312 can be reliably prevented from remaining attached to the composite film back surface 2B and being undesirably separated from the formation substrate 310.

Also, in the electronic structure 301, the diameter of the lower substrate recess portion 310DL of the substrate recess 310D in the imaginary cross-section parallel to the XY plane is larger than the diameter of the upper substrate recess portion 310DU of the substrate recess 310D in the imaginary cross-section parallel to the XY plane (see FIG. 16C). Thus, in the electronic structure 301, the roots 312R of the micro-spacers 312 can be reliably prevented from coming off the substrate recesses 310D in the Z direction.

In other respects, the electronic structure 301 according to the third embodiment can provide the same effects and advantages as the electronic structure 1 according to the first embodiment.

4. Fourth Embodiment

Figure 19A:
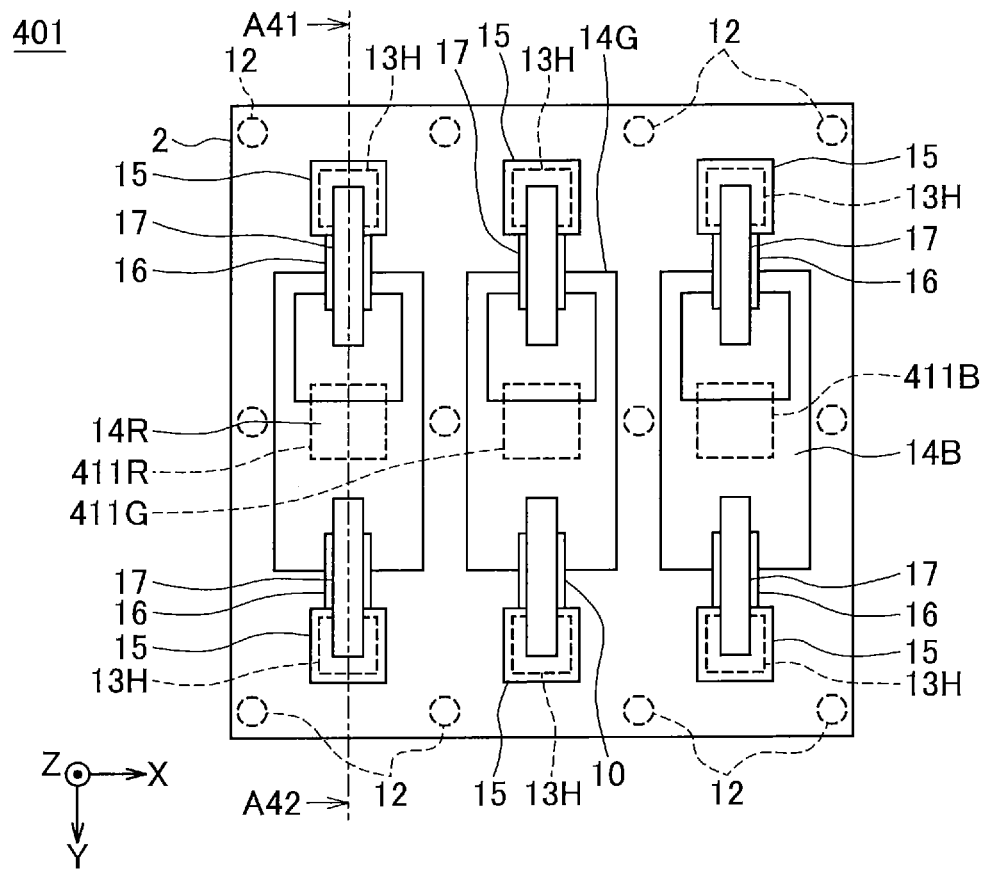
FIGS. 19A and 19B are a schematic plan view and a schematic cross-sectional view illustrating a configuration of an electronic structure according to a fourth embodiment.
Figure 19B:
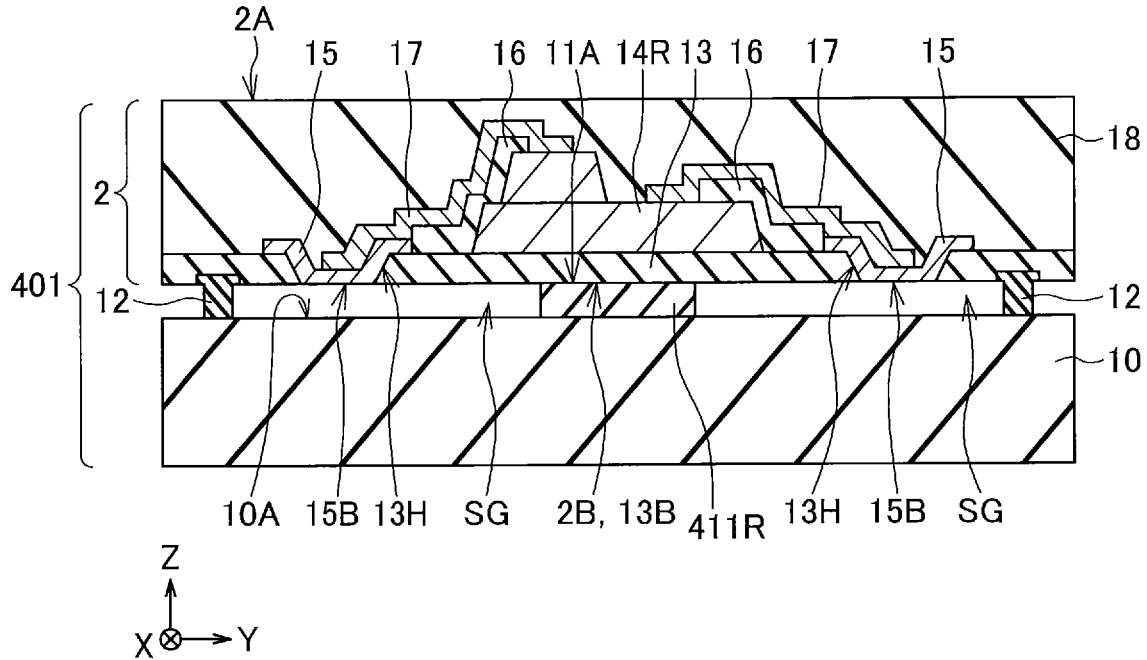

FIG. 19A, corresponding to FIG. TA, is a schematic plan view illustrating configurations of an electronic structure 401 and a composite film 2 according to a fourth embodiment. FIG. 19B, corresponding to FIG. 1B, is a schematic cross-sectional view illustrating a cross-section taken along line A41-A42 of FIG. 19A. In the fourth embodiment, X, Y, and Z directions are defined in the same manner as in the first embodiment.

The electronic structure 401 is different from the electronic structure 1 of the first embodiment in having support layers 411R, 411G, and 411B (which may be referred to as support layers 411) instead of the support layer 11, but otherwise the same. The support layers 411 are different from the support layer 11 of the first embodiment in that the support layers 411R, 411G, and 411B are formed at three positions under the light emitting elements 14R, 14G, and 14B, respectively.

Thus, in the electronic structure 401, the area of the portion of the support layer 11 left without being removed in the etching process (see FIG. 4D) is larger than that in the electronic structure 1 of the first embodiment. Thus, in the electronic structure 401, it is possible to reduce the time required for the etching process and improve the manufacturing efficiency of the electronic structure 401 as compared to the first embodiment.

In other respects, the electronic structure 401 according to the fourth embodiment can provide the same effects and advantages as the electronic structure 1 according to the first embodiment.

5. Fifth Embodiment

Figure 20A:
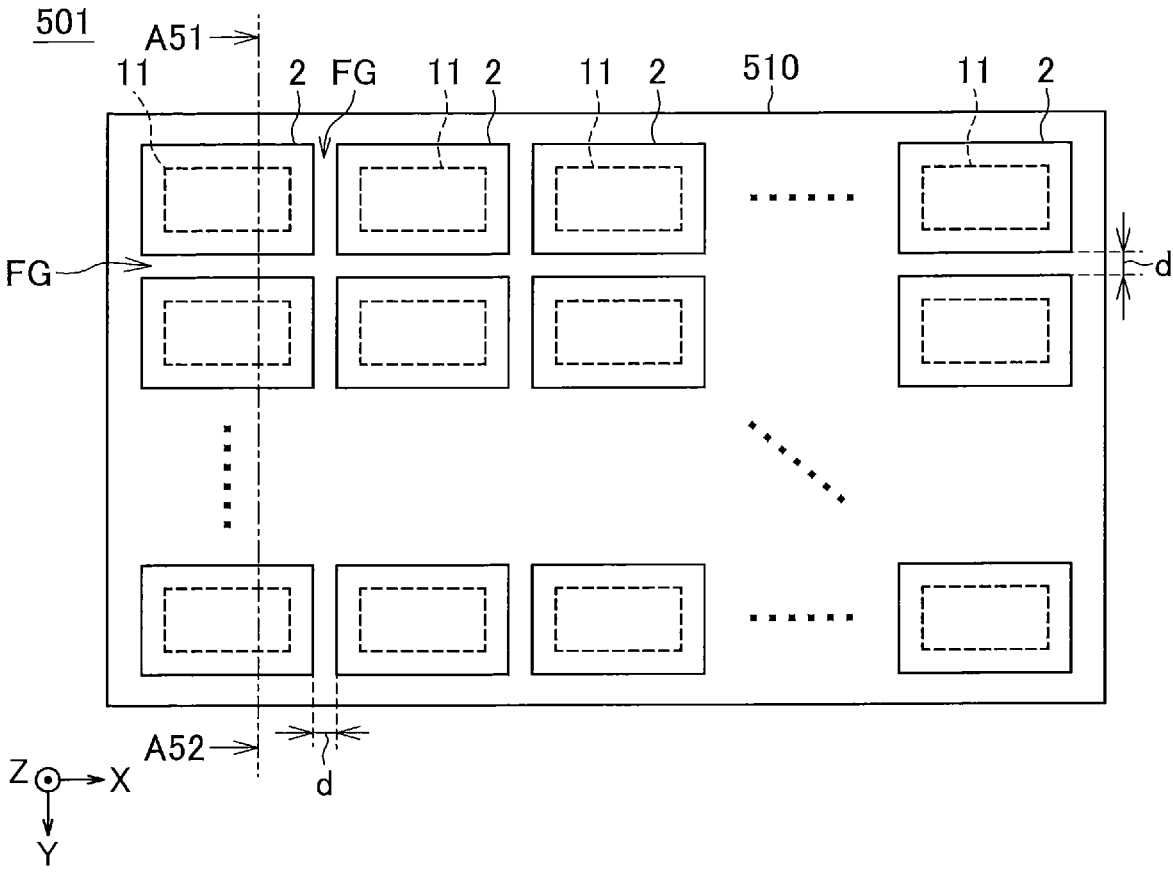
FIGS. 20A and 20B are a schematic plan view and a schematic cross-sectional view illustrating a configuration of an electronic structure according to a fifth embodiment.
Figure 20B:
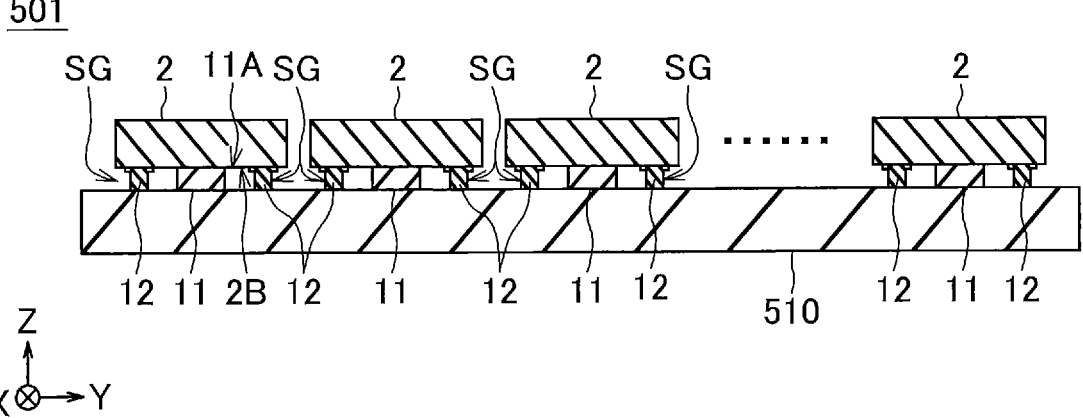

FIG. 20A is a schematic plan view illustrating a configuration of an electronic structure 501 according to a fifth embodiment. FIG. 20B is a schematic cross-sectional view illustrating a cross-section taken along line A51-A52 of FIG. 20A. The electronic structure 501 has a configuration in which multiple support layers 11 are disposed on a formation substrate 510, and multiple composite films 2 are attached to the upper sides of the respective support layers 11.

The formation substrate 510 is formed by the same material as the formation substrate 10 (see FIGS. 1A and 1B, etc.) of the first embodiment. A front surface of the formation substrate 510 on the Z direction side is extremely smooth, similarly to the formation substrate 10. However, the formation substrate 510 is sufficiently larger in size in the X and Y directions than the formation substrate 10.

The multiple composite films 2 are arranged above (or on the Z direction side of) the formation substrate 510 in a matrix in the X and Y directions. In each of the X and Y directions, each adjacent pair of the composite films 2 forms a film gap FG having a distance d therebetween. Each support layer 11 is formed in the same manner as the support layer 11 of the first embodiment, and a support gap SG is formed around each support layer 11.

In the electronic structure 501, at the multiple positions on the upper side of the formation substrate 510, a process that is the same as that of the manufacturing step group Q1 (see FIG. 2) of the first embodiment is performed in parallel. At this time, the electronic structure 501 is manufactured in a stepwise manner by a manufacturing, separation, and mounting apparatus 580 (to detailed later) instead of the apparatus 80.

Figure 21A:
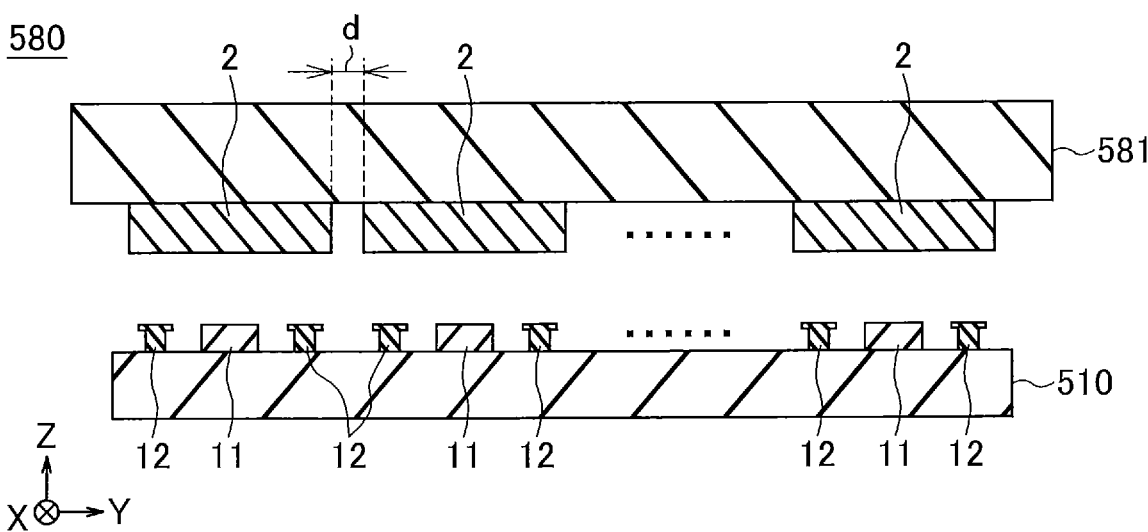
FIGS. 21A and 21B are schematic cross-sectional views illustrating separation of composite films according to the fifth embodiment.

Then, as illustrated in FIG. 21A, corresponding to FIG. 5B, the apparatus 580 performs the same process as in the separation step group Q2 (see FIG. 2) of the first embodiment, on the composite films 2 of the electronic structure 501 in parallel.

Specifically, the apparatus 580 adheres a stamp 581 to the composite films 2, and separates the composite films 2 from the respective support layers 11 in parallel. At this time, the composite films 2 remain arranged in a matrix on an XY plane, and the gaps between the composite films 2 remain unchanged at the distance d.

Figure 21B:
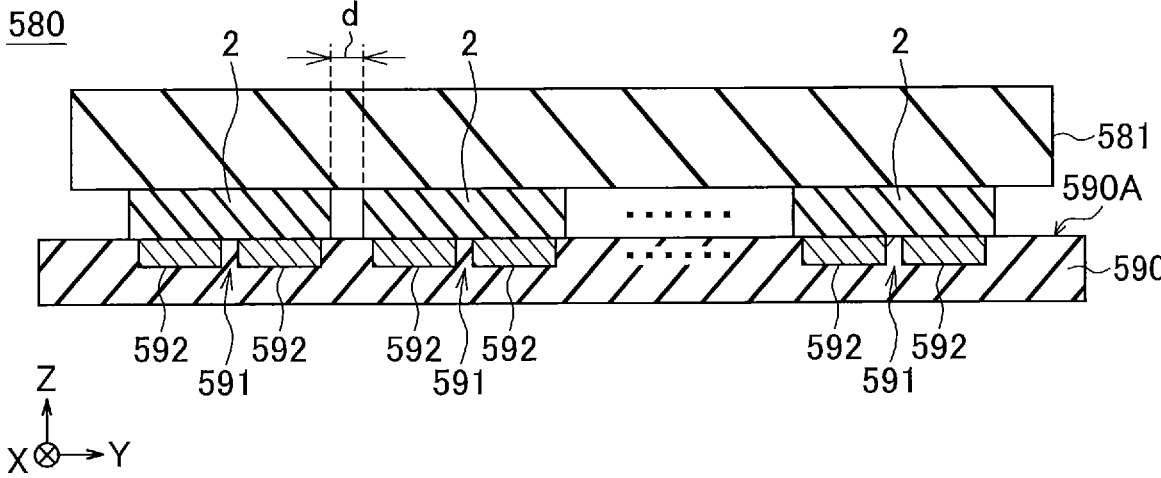

Then, the apparatus 580 performs the same process as in the mounting step group Q3 (see FIG. 2) of the first embodiment in parallel. Specifically, as illustrated in FIG. 21B, the apparatus 580 attaches and mounts the composite films 2 to multiple mounting portions 591 provided in a wiring substrate front surface 590A of a wiring substrate 590, and then separates the stamp 581 from the composite films 2.

Thereby, composite film back surfaces 2B of the composite films 2 are mounted on the mounting portions 591 of the wiring substrate front surface 590A, and connection pads 15 (see FIGS. 1A and 1B, etc.) of the composite films 2 are electrically connected to electrodes 592 of the wiring substrate 590. At this time, the composite films 2 remain arranged in a matrix on the XY plane, and the gaps between the composite films 2 remain unchanged at the distance d. The wiring substrate 590 with the composite films 2 mounted thereon is, for example, a display panel to be installed in an LED display device, and each composite film 2 corresponds to one pixel.

In the above configuration of the electronic structure 501 of the fifth embodiment, the multiple support layers 11 and composite films 2 are arranged in a matrix on the front surface of the formation substrate 510 (see FIGS. 20A and 20B). The apparatus 580 adheres the stamp 581 to the composite films 2 to separate them from the support layers 11 at a time, and attaches the composite films to the respective mounting portions 591 of the wiring substrate 590 (see FIGS. 21A and 21B).

Thus, the electronic structure 501 allows the multiple composite films 2 to be mounted to the wiring substrate by performing the separation process and mounting process only once, which can significantly improve the operating efficiency as compared to the first embodiment.

Also, while the apparatus 580 adheres the stamp 581 to the multiple composite films 2 and attaches the composite films 2 to the wiring substrate 590, it maintains the arrangement of the composite films 2. Specifically, the composite films 2 are kept arranged in a matrix, and the gaps between the composite films 2 are kept at the distance d.

If the manufacturing, separation, and mounting apparatus uses the stamp 81 (see FIGS. 5A to 5C) of the first embodiment, the apparatus will need to repeat a process of separating one of the composite films 2 from the formation substrate 510 and attaching it to one of the mounting portions 591 of the wiring substrate 590. At this time, the apparatus needs to position each composite film 2 at the position of the corresponding mounting portion 591 on the wiring substrate 590.

In particular, in a case where the wiring substrate 590 is a display panel and each composite film 2 represents one pixel, when the composite films 2 are mounted, they are required to be positioned with extremely high accuracy. However, in the mounting process by the apparatus, position errors may occur, or the positioning may take time.

In this regard, in the electronic structure 501 of the present embodiment, the positions of the composite films 2 and support layers 11 on the formation substrate 510 can be appropriately set in advance according to the arrangement of and intervals between the mounting portions 591 of the wiring substrate 590. Specifically, in the electronic structure 501, it is possible to optimize the gaps between the composite films 2 on the formation substrate 510 with a positional accuracy of an exposure process or the like in a semiconductor manufacturing process, and mount the composite films 2 onto the wiring substrate 590 while maintaining the gaps.

Thus, in the electronic structure 501, it is possible to mount the composite films 2 to the wiring substrate with extremely high positional accuracy in the extremely short time required to perform the separation and mounting processes once, by using the stamp 581 (see FIGS. 21A and 21B) of the apparatus 580.

In other respects, the electronic structure 501 according to the fifth embodiment can provide the same effects and advantages as the electronic structure 1 according to the first embodiment.

6. Other Embodiments

The above first embodiment describes a case where the flange portions 12F are formed in the micro-spacers 12 (see FIG. 2, etc.). However, this is not mandatory. For example, the flange portions 12F may be omitted. In this case, for example, in the step illustrated in FIG. 3C, it is possible to deposit organic material to the same levels as the upper ends of the support holes 11H, or remove the parts protruding above (or on the Z direction side of) the support layer front surface 11A of the support layer 11. In order to ensure the smoothness of the base film back surface 13B, the position of the upper end, i.e., the end on the Z direction side, of each micro-spacer 12 should be above (or on the Z direction side of) a position 10 nm below the support layer front surface 11A (or away from the support layer front surface 11A in the −Z direction). The same applies to the second to fifth embodiments.

Also, the above first embodiment describes a case where each micro-spacer 12 is formed to be substantially cylindrical, and the multiple micro-spacers 12 disposed in the electronic structure 1 have the same shape (see FIGS. 1A and 1B, etc.). However, this is not mandatory. For example, each micro-spacer 12 may have pillar shapes, such as elliptical column shapes or quadrangular prism shapes, having various cross-sectional shapes. Alternatively, each micro-spacer 12 may have shapes having cross-sectional shapes varying in the Z direction, such as shapes that become gradually thicker or thinner in the Z direction. Also, the multiple micro-spacers 12 disposed in the electronic structure 1 may have different shapes. The same applies to the second to fifth embodiments.

Moreover, the above first embodiment describes a case where the support layer 11 abuts the composite film back surface 2B at or near the center of the composite film back surface 2B, and two micro-spacers 12 are disposed opposite each other with the support layer 11 therebetween (see FIGS. 1A and 1B). However, this is not mandatory. The support layer 11 and micro-spacers 12 may be disposed in contact with the composite film back surface 2B at arbitrary positions on the composite film back surface 2B. For example, it is possible that the support layer 11 is disposed near an outer periphery of the composite film back surface 2B, and the micro-spacers 12 are disposed at other portions. The same applies to the second to fifth embodiments.

Moreover, the above first embodiment describes a case where 12 micro-spacers 12 are provided in the electronic structure 1 (see FIGS. 1A and 1B, etc.). However, this is not mandatory. Not more than 11 or not less than 13 micro-spacers 12 may be provided in the electronic structure 1. The same applies to the second to fifth embodiments.

Moreover, the above second embodiment describes a case where, in the step illustrated in FIG. 11D, each covering layer 221 is disposed to cover an area that encompasses the flange portion 12F of the corresponding micro-spacer 12 and is slightly larger than the flange portion 12F. However, this is not mandatory. For example, each covering layer 221 may be disposed such that at least part of the covering layer 221 protrudes outside the flange portion 12F. In short, each covering layer 221 should be disposed so that, compared to the first embodiment (see FIGS. 1A and 1B, etc.), the area of contact between the micro-spacer 12 and the base film 213 after removal of the covering layer 221 can be reduced, and the adhesion force acting between the micro-spacer 12 and the base film 213 can be reduced. Also, in this case, each covering layer 221 should be disposed so that at least part of the covering layer 221 is in direct contact with the support layer 11, and when part of the support layer 11 is removed by the etchant, the covering layer 221 can also be removed.

Moreover, the above third embodiment describes a case where, in the step illustrated in FIG. 16C, for each substrate recess 310D, a diameter of the lower substrate recess portion 310DL is larger than a diameter of the upper substrate recess portion 310DU. However, this is not mandatory. For example, a diameter of the lower substrate recess portion 310DL may be equal to or smaller than a diameter of the upper substrate recess portion 310DU. In short, each substrate recess 310D should be formed to increase the area of contact between the micro-spacer 312 and the formation substrate 310 and make the micro-spacer 312 less likely to come off the formation substrate 310, compared to the first embodiment.

Moreover, the above first embodiment describes a case where the base film 13 and cover layer 18 of the composite film 2 and the micro-spacers 12 are formed by organic material, the support layer 11 is formed by inorganic material, and part of the support layer 11 is removed by etching. However, this is not mandatory. For example, it is possible that the composite film is protected by inorganic material, the micro-spacers 12 are also formed by inorganic material, the support layer 11 is formed by organic material, and part of the support layer 11 is removed by etching. In this case, for example, dry etching using oxygen (02) may be performed as the etching. The same applies to the second to fifth embodiments.

Moreover, the above first embodiment describes a case where, in the step illustrated in FIG. 4D, the etching removes part of the support layer 11 while leaving the other part. However, this is not mandatory. For example, the support layer 11 may be completely removed. The same applies to the second to fifth embodiments.

Moreover, the above first embodiment describes a case where a silicon substrate formed by silicon (Si), a glass substrate, a sapphire substrate, or the like is used as the formation substrate 10. However, this is not mandatory. Other substrates formed by various inorganic materials may be used as the formation substrate 10. In this case, the front surface of the formation substrate 10 should be formed to be extremely smooth, and for example should have a surface roughness of 10 nm or less. The same applies to the second to fifth embodiments.

Moreover, the above first embodiment describes a case where the support layer 11 is formed as an oxide film formed by silicon oxide (SiO$_2$) or a nitride film formed by silicon nitride (SiN). However, this is not mandatory. The support layer 11 may be formed as a thin film by various oxides, various nitrides, and other various inorganic materials, as long as the support layer front surface 11A can be formed to be extremely smooth, and the support gap SG can be formed by removing part of the support layer 11 by etching in step SP10 of the process RT1 (see FIG. 2). The same applies to the second to fifth embodiments.

Moreover, the above first embodiment describes a case where the composite film 2 has edges in the X and Y directions having lengths of about 30 to 50 μm, and an outline of the support layer 11 is located inside and significantly away from an outline of the composite film 2. However, this is not mandatory. The composite film 2 and support layer 11 may have other various sizes. For example, it is possible that the composite film 2 has edges in the X and Y directions having lengths of about 1 to 2 mm, and an outline of the support layer 11 is located about 20 μm inside an outline of the composite film 2. The same applies to the second to fifth embodiments.

Moreover, the above first embodiment describes a case where the connection pads 15 are formed by gold (Au) or platinum (Pt). However, this is not mandatory. For example, the connection pads 15 may be formed by conductive metal materials, such as copper (Cu) or aluminum (Al), or alloys composed of multiple types of materials. In these cases, it is preferable to select the etchant in step SP10 of the process RT1 (see FIG. 2) so that the etchant damages the surfaces of the connection pads 15 as little as possible. The same applies to the second to fifth embodiments.

Moreover, the above first embodiment describes a case where the micro-spacers 12 are formed by only organic material such as polyimide resin. However, this is not mandatory. For example, for purposes such as improving various properties, the micro-spacers 12 may be formed by a hybrid material consisting primarily of organic material and containing inorganic material, such as inorganic filler. In this case, the ratio by volume of the inorganic material to the organic material is preferably about 10% or less. The same applies to the base film 13 and cover layer 18. Also, each of the support layer 11 and formation substrate 10 may be formed by a hybrid material consisting primarily of inorganic material and containing organic material, such as organic filler, instead of being formed by only inorganic material. The same applies to the second to fifth embodiments.

Moreover, the above first embodiment describes a case where the formation substrate 10 consists only of inorganic material. However, this is not mandatory. For example, various treatments, such as coating, may be applied to the surface of the inorganic material to improve various properties, such as smoothness. Also, the formation substrate 10 may have a multi-layer structure in which different types of materials are stacked appropriately, instead of a single-layer structure consisting of one type of material. Various treatments may be applied to surfaces of organic materials such as the micro-spacers 12, base film 13, and cover layer 18. The same applies to the second to fifth embodiments.

Moreover, the above first embodiment describes a case where, in step SP10 of the process RT1 (see FIG. 2), part of the support layer 11 is removed by using an etching liquid. However, this is not mandatory. For example, part of the support layer 11 may be removed by using an etching gas, as long as the micro-spacers 12 can be left. The same applies to the second to fifth embodiments.

Moreover, the above first embodiment describes a case where the three light emitting elements 14 are provided in the composite film 2, and emit light of different colors (see FIG. 1A, etc.). However, this is not mandatory. For example, not more than 2 or not less than 4 light emitting elements 14 may be provided in the composite film 2. In this case, the light emitting elements may emit light of different colors, or some or all of the light emitting elements may emit light of the same color. Also, the light emitting elements 14 need not be necessarily disposed in a line in the X direction, and may be disposed in various arrangements. The same applies to the second to fifth embodiments.

Moreover, the above first embodiment describes a case where the light emitting elements 14 (i.e., LEDs) are provided in the composite film 2 (see FIGS. 1A and 1B, etc.). However, this is not mandatory. For example, various elements having various electronic functions, such as electronic elements such as resistors, capacitors, light receiving elements, piezoelectric elements, or various sensor elements, or semiconductor elements such as transistors or integrated circuits (ICs) may be provided in the composite film 2. In this case, multiple elements, such as multiple electronic elements, may be provided in one composite film 2, and multiple elements, such as multiple electronic elements, of the same type or different types may be provided in one composite film 2. The same applies to the second to fifth embodiments.

Moreover, the above first embodiment describes a case where two connection pads 15 are provided to one light emitting element 14 in the composite film 2 (see FIGS. 1A and 1B, etc.). However, this is not mandatory. Any number of connection pads or lower electrodes may be provided to one electronic element. The same applies to the second to fifth embodiments.

Moreover, the above first embodiment describes a case where the wiring substrate 90 is a circuit substrate consisting primarily of glass epoxy. However, this is not mandatory. For example, various circuit substrates, such as film-shaped flexible circuit substrates may be used as the wiring substrate 90. In this case, it is required that the surface of the circuit substrate be formed to be extremely smooth and allow the composite film 2 to adhere to the surface. The same applies to the second to fifth embodiments.

Moreover, the above fifth embodiment describes a case where the composite films 2 of the electronic structure 501 are arranged in a matrix on an XY plane (see FIG. 20A). However, this is not mandatory. For example, the composite films 2 may be arranged in various arrangement patterns, such as staggered patterns, as long as the composite films 2 are disposed at positions corresponding to the respective mounting portions 591 on the wiring substrate 590.

Moreover, the above fifth embodiment describes a case where the gaps between the composite films 2 in the X and Y directions each have the distance d. However, this is not mandatory. For example, the gaps in the X direction may differ in distance from the gaps in the Y direction, or the composite films 2 may be arranged at irregular intervals, as long as the composite films 2 are disposed at positions corresponding to the respective mounting portions 591 on the wiring substrate 590.

Moreover, the present disclosure is not limited to the above embodiments. Specifically, the scope of the present disclosure covers embodiments obtained by arbitrarily combining some or all of the above embodiments, and embodiments obtained by extracting part of the above embodiments. For example, the second and third embodiments may be combined such that the roots 312R of the micro-spacers 312 are formed, and the covering layers 221 are formed and then removed together with part of the support layer 11.

Moreover, the above embodiments describe a case where the electronic structure 1 as an electronic structure is constituted by the formation substrate 10 as a substrate, the composite film 2 as a functional element unit, the support layer 11 as a support, and the micro-spacers 12 as projections. However, the present disclosure is not limited to this. Electronic structures may be constituted by substrates, functional element units, supports, and projections that have other various configurations.

The present disclosure can be used in manufacturing a display panel to be installed in an LED display device, for example.

What is claimed is:

1. An electronic structure, comprising:
a substrate having a first surface;
a functional element unit including a functional element having an electronic function, and a protector covering the functional element, the functional element unit having a second surface facing the first surface;
a support disposed between the first surface of the substrate and the second surface of the functional element unit, the support supporting the second surface of the functional element unit; and
a projection disposed on a first surface side of the substrate, the projection projecting toward the functional element unit,
wherein the functional element unit has a protector recess depressed from the second surface, the protector recess being provided in the protector forming the second surface and located at a position facing the projection,
wherein the support has a third surface in contact with the second surface of the functional element unit, the third surface having an area smaller than an area of the second surface,
wherein the projection has a fourth surface in contact with or located close to the functional element unit, the fourth surface having an area smaller than the area of the second surface, the projection being formed by a different material from the support,
wherein the functional element unit is separable from the support and the projection, and
wherein the fourth surface of the projection is located within the protector recess.

2. The electronic structure of claim 1, wherein one of the support and the projection consists primarily of organic material, and another of the support and the projection consists primarily of inorganic material.

3. The electronic structure of claim 1, wherein
the substrate has a substrate recess depressed from the first surface, and
the projection has a root located in the substrate recess.

4. The electronic structure of claim 3, wherein the substrate recess has a first substrate recess portion located at a first depth from the first surface and has a second substrate recess portion located at a second depth from the first surface, that is farther from the first surface than is the first depth, a diameter of the second substrate recess portion in a cross-section parallel to the first surface being larger than a diameter of the first substrate recess portion in a cross-section parallel to the first surface.

5. The electronic structure of claim 1, wherein at least part of an inner surface of the protector recess is separate from the fourth surface of the projection.

6. The electronic structure of claim 1, wherein
the electronic structure comprises a plurality of the projections, and
two of the plurality of the projections are located opposite each other with the support between the two projections.

7. A method of manufacturing an electronic structure, the method comprising:
preparing a substrate having a first surface;
forming a support layer on the first surface of the substrate;
forming a projection in the support layer on the first surface of the substrate;
forming, on the support layer and the projection, a functional element unit including a functional element having an electronic function, and a protector covering the functional element, the functional element unit having a second surface, the support layer having a third surface, the projection having a fourth surface, the second surface facing the third surface and the fourth surface; and removing at least part of the support layer, wherein the projection is formed such that an area of the fourth surface is smaller than an area of the second surface, and is formed by a material different from a material of the support layer.

8. The method of claim 7, wherein in removing at least part of the support layer, part of the support layer is removed while leaving the other part of the support layer.

9. The method of claim 7, wherein removing at least part of the support layer includes partially removing the support layer while leaving a remaining portion of the support layer to form a support between the substrate and the functional element unit, the support being spaced apart from the projection in a direction parallel to the first surface.

10. The method of claim 7, wherein removing at least part of the support layer includes removing the support layer entirely.

11. The method of claim 7, wherein the projection is made of a resin.

12. A method of manufacturing an electronic circuit, the method comprising:

separating the functional element unit of the electronic structure of claim 1 from the support and the projection, and transferring the functional element unit to another substrate different from the substrate.

13. The electronic structure of claim 1, wherein the projection is made of a resin.

14. An electronic structure, comprising:

a substrate having a first surface;

a functional element unit including a functional element having an electronic function, and a protector covering the functional element, the functional element unit having a second surface facing the first surface; and a projection disposed on a first surface side of the substrate, the projection projecting toward the functional element unit, wherein the projection has a third surface having an area smaller than an area of the second surface, the third surface being in contact with or positioned close to the functional element unit, wherein the protector of the functional element unit has a protector recess at the second surface at a position facing the projection in a thickness direction of the substrate, the protector recess being recessed in a direction away from the first surface from the second surface, wherein the third surface of the projection is located within the protector recess.

15. The electronic structure of claim 14, wherein the substrate has a substrate recess at the first surface, and a portion of the projection is embedded in the substrate recess.

16. The electronic structure of claim 15, wherein the substrate recess has a first substrate recess portion located at a first depth from the first surface and a second substrate recess portion located at a second depth that is farther from the first surface than is the first depth, a diameter of the second substrate recess portion in a cross section parallel to the first surface being larger than a diameter of the first substrate recess portion in a cross section parallel to the first surface.

17. The electronic structure of claim 14, wherein at least part of an inner surface of the protector recess is spaced apart from the third surface of the projection.

18. The electronic structure of claim 14, wherein the electronic structure comprises a plurality of the projections.

19. A method of manufacturing an electronic circuit, the method comprising:

separating the functional element unit of the electronic structure of claim 14 from the projection, and transferring the functional element unit to another substrate different from the substrate.

20. A method of manufacturing an electronic circuit, the method comprising:

preparing an electronic structure, comprising:

a substrate having a first surface;

a functional element unit including a functional element having an electronic function, and a protector covering the functional element, the functional element unit having a second surface facing the first surface;

a support disposed between the first surface of the substrate and the second surface of the functional element unit, the support supporting the second surface of the functional element unit; and a projection disposed on a first surface side of the substrate, the projection projecting toward the functional element unit, wherein the support has a third surface in contact with the second surface of the functional element unit, the third surface having an area smaller than an area of the second surface, wherein the projection has a fourth surface in contact with or located close to the functional element unit, the fourth surface having an area smaller than the area of the second surface, the projection being formed by a different material from the support, and wherein the functional element unit is separable from the support and the projection, separating the functional element unit of the electronic structure from the support and the projection, and transferring the functional element unit to another substrate different from the substrate.

\* \* \* \* \*